(12) United States Patent
Kim et al.

(10) Patent No.: US 10,709,026 B2
(45) Date of Patent: Jul. 7, 2020

(54) PRINTED CIRCUIT BOARD MOUNTING STRUCTURE AND DISPLAY APPARATUS INCLUDING THE SAME

(71) Applicant: SAMSUNG ELECTRONICS CO., LTD., Suwon-si, Gyeonggi-do (KR)

(72) Inventors: Song Hyeon Kim, Suwon-si (KR); Sung Soo Jung, Suwon-si (KR); Dae Sung Ko, Seoul (KR); Jun Pil Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/042,861

(22) Filed: Jul. 23, 2018

(65) Prior Publication Data

US 2018/0352665 A1    Dec. 6, 2018

Related U.S. Application Data

(62) Division of application No. 15/355,523, filed on Nov. 18, 2016, now Pat. No. 10,064,295.

(30) Foreign Application Priority Data

Dec. 4, 2015    (KR) ........................ 10-2015-0171975

(51) Int. Cl.
   *H05K 5/00*    (2006.01)
   *G06F 1/16*    (2006.01)
   (Continued)

(52) U.S. Cl.
   CPC .......... *H05K 5/0017* (2013.01); *G06F 1/1601* (2013.01); *G06F 1/183* (2013.01);
   (Continued)

(58) Field of Classification Search
   USPC .................................. 361/752, 807, 809, 810
   See application file for complete search history.

(56) References Cited

U.S. PATENT DOCUMENTS 5,748,451 A * 5/1998 Thompson ........... H05K 1/0263
                                                         361/775
5,958,556 A * 9/1999 McCutcheon ....... H05K 1/0271
                                                         174/161 R
(Continued)

FOREIGN PATENT DOCUMENTS

CN    1392767 A    1/2003
CN    2763875 Y    3/2006
(Continued)

OTHER PUBLICATIONS

European Office Action dated Oct. 23, 2018 in corresponding European Patent Application No. 16871039.0.
(Continued)

*Primary Examiner* — Hung S. Bui
(74) *Attorney, Agent, or Firm* — Staas & Halsey LLP

(57) ABSTRACT

A Printed Circuit Board (PCB) mounting structure having an improved structure for improving assemblability of a product, and a display apparatus including the PCB mounting structure. The PCB mounting structure includes a mounting member provided on the PCB and a mounting portion provided on a chassis for mounting the PCB to the chassis without using screws.

17 Claims, 32 Drawing Sheets

(51) Int. Cl.
*G06F 1/18* (2006.01)
*H05K 7/14* (2006.01)

(52) U.S. Cl.
CPC ............. *G06F 1/184* (2013.01); *H05K 7/142* (2013.01); *H05K 7/1427* (2013.01)

(56) References Cited

U.S. PATENT DOCUMENTS

| | | |
|---|---|---|
| 6,186,800 B1 | 2/2001 | Klein et al. |
| 6,259,032 B1 * | 7/2001 | Fernandez ............... H01R 4/64 174/138 E |
| 6,424,537 B1 | 7/2002 | Paquin et al. |
| 6,695,629 B1 * | 2/2004 | Mayer .................... H05K 7/142 361/752 |
| 6,746,254 B2 | 6/2004 | Hooper |
| 6,799,980 B2 * | 10/2004 | Bloomfield .............. H01R 4/66 439/92 |
| 6,906,266 B2 * | 6/2005 | Verrigni .................. G06F 1/184 174/138 G |
| 7,212,400 B2 * | 5/2007 | Fan ......................... G06F 1/184 174/138 G |
| 7,385,830 B2 * | 6/2008 | Liu ......................... H05K 7/142 174/138 R |
| 7,564,680 B2 | 7/2009 | Kim et al. |
| 7,609,525 B2 * | 10/2009 | Fan ......................... H05K 7/142 312/223.2 |
| 8,937,814 B2 * | 1/2015 | Tu .......................... G06F 1/184 174/138 E |
| 2003/0201376 A1 | 10/2003 | Knight et al. |
| 2005/0174726 A1 | 8/2005 | Bang et al. |
| 2006/0044745 A1 | 3/2006 | Kim |
| 2006/0114662 A1 | 6/2006 | Liu et al. |
| 2007/0195219 A1 | 8/2007 | Moon et al. |
| 2007/0249224 A1 | 10/2007 | Bang et al. |
| 2009/0215292 A1 | 8/2009 | Rueggen et al. |

FOREIGN PATENT DOCUMENTS

| | | |
|---|---|---|
| GB | 2474509 | 4/2011 |
| KR | 1999-0040156 | 11/1999 |
| KR | 10-0637212 | 10/2006 |
| KR | 10-2008-0005732 | 1/2008 |

OTHER PUBLICATIONS

International Search Report dated Mar. 15, 2017 in International Patent Application No. PCT/KR2016/013974 (3 pages).
Notice of Allowance Office Action dated Jun. 4, 2018 in co-pending U.S. Appl. No. 15/355,523 (7 pages).
Non-final Office Action dated Jan. 16, 2018 in co-pending U.S. Appl. No. 15/355,523 (19 pages).
Office Action (Restriction) dated Sep. 22, 2017 in co-pending U.S. Appl. No. 15/355,523 (7 pages).
U.S. Appl. No. 15/355,523, filed Nov. 18, 2016, Song Hyeon Kim et al., Samsung Electronics Co., Ltd.
Korean Patent Office Action issued in Korean Patent Application No. 10-2015-0171975 dated Jul. 30, 2019.
Chinese Office Action dated Nov. 7, 2019 in corresponding Chinese Patent Application No. 201680070910.4.

* cited by examiner

PRINTED CIRCUIT BOARD MOUNTING STRUCTURE AND DISPLAY APPARATUS INCLUDING THE SAME

CROSS-REFERENCE TO RELATED APPLICATIONS

This application is a Divisional of U.S. patent application Ser. No. 15/355,523, filed on Nov. 18, 2016, which claims the benefit of Korean Patent Application No. 10-2015-0171975, filed on Dec. 4, 2015 in the Korean Intellectual Property Office, the disclosure of which is incorporated herein by reference.

BACKGROUND

1. Field

Embodiments of the present disclosure relate to a structure for mounting a Printed Circuit Board (PCB) used in an electrical device, particularly, a display apparatus, and more particularly, to a PCB mounting structure having an improved structure for improving assemblability of a product, and a display apparatus including the PCB mounting structure.

2. Description of the Related Art

A display apparatus is a kind of output apparatus that converts electrical information into visual information to display the visual information for users. The display apparatus includes a television, a monitor, and various kinds of portable terminals (for example, a smart phone, a tablet PC, and the like).

The display apparatus also includes a Cathode Ray Tube (CRT) display, a Light Emitting Diodes (LED) display, an Organic Light Emitting Diode (OLED) display, an Active-Matrix Organic Light Emitting Diode (AMOLED) display, a Liquid Crystal Display (LCD), and an Electronic Paper Display (EPD).

In order to couple the components of the display apparatus with each other, screws are generally used. For example, the components of the display apparatus include various kinds of panels and chassis. In the case of coupling the components of the display apparatus using screws, a separate fastening tool for fastening the screws is needed, which may result in an increase of manufacturing costs. Also, time for fastening the screws is required, which may result in an increase of manufacturing time.

SUMMARY

Additional aspects and/or advantages will be set forth in part in the description which follows and, in part, will be apparent from the description, or may be learned by practice of the embodiments.

Therefore, it is an aspect of the present disclosure to provide a Printed Circuit Board (PCB) mounting structure having an improved structure for easily mounting a PCB.

It is another aspect of the present disclosure to provide a display apparatus having an improved structure for easily mounting a PCB.

Additional aspects of the disclosure will be set forth in part in the description which follows and, in part, will be obvious from the description, or may be learned by practice of the disclosure.

In accordance with an aspect of the present disclosure, there is provided a Printed Circuit Board (PCB) mounting structure including: a chassis on which a plurality of board resting portions are disposed; a PCB rested on the plurality of board resting portions; a mounting portion disposed on at least one board resting portion of the plurality of board resting portions; and a mounting member fixed on the PCB, and removably coupled with the mounting portion by sliding movement of the PCB.

The mounting member may include a coupling portion configured to be removably coupled with the mounting portion. The mounting portion may include an insertion hole into which the coupling portion is inserted so that the coupling portion of the mounting member is accommodated in the inside of the mounting portion.

The coupling portion may include a pressing section configured to press an area of the inner surface of the mounting portion if the coupling portion is inserted in the insertion hole.

The coupling portion may include a guide section configured to facilitate insertion into the insertion hole.

The coupling portion may include a closing section configured to close the insertion hole if the coupling portion is inserted in the insertion hole.

The mounting portion may include a thickness forming portion protruding toward the inside of the mounting portion in the area of the inner surface of the mounting portion, pressed by the pressing section.

The PCB may include an installation hole in which the mounting member is installed. The mounting member may include a support portion rested and supported on the PCB, and a lead protruding from the support portion and inserted in the installation hole of the PCB. The mounting member may include a conductive material, and at least one of the support portion and the lead is bonded on the PCB in such a way to be electrically connected to the PCB.

The support portion may include a first support section, and a second support section protruding from the first support section toward the PCB. The mounting member may be supported by the second support section rested on the PCB.

The PCB may include a support portion accommodating groove configured to accommodate the second support section. The mounting member may be supported by the first support section rested on the PCB.

The plurality of board resting portions may protrude from the chassis toward the PCB, and may be electrically connected to the chassis.

At least one board resting portion of the plurality of board resting portions may include a guide protrusion configured to guide a resting position or a sliding direction of the PCB. The PCB may include a guide groove to accommodate the guide protrusion.

At least one board resting portion of the plurality of board resting portions may include a stopper configured to prevent the PCB from moving when the PCB is mounted at a predetermined position. The PCB may include a stopper accommodating groove configured to accommodate the stopper.

The mounting portion may be bonded on the board resting portion in such a way to be electrically connected to the board resting portion, or the mounting portion is integrated into the board resting portion. The mounting portion may include a neck connected to the board resting portion, and a head connected to the neck and having a cross-sectional area that is wider than a cross-sectional area of the neck.

The PCB may include a first through hole through which the head of the mounting portion passes, and a first guide hole which extends from the first through hole and along which the neck of the mounting portion slides, The mounting member may include a second through hole corresponding to the first through hole, and a second guide hole corresponding to the first guide hole.

The mounting member may include a support portion supported on the PCB, and a pressing portion extending from the support portion and configured to press at least one of the head and the PCB. The second through hole may be formed in the support portion of the mounting member, and the second guide hole is formed in the pressing portion.

The pressing portion may include an arc structure protruding from the PCB. The second guide hole may extend from the second through hole to the top portion of the arc structure. If the PCB is mounted, the head may press the arc structure so that the pressing portion of the mounting member presses the PCB.

The mounting portion may include a stopper protruding from the head toward the PCB. The mounting member may include a stopper accommodating groove formed in the top portion of the arc structure.

In accordance with an aspect of the present disclosure, there is provided a Printed Circuit Board (PCB) mounting structure including: a chassis on which a PCB is mounted; and a mounting member rotatably fixed on the chassis, and configured to rotate to fix the PCB on the chassis.

The mounting member may include a coupling portion removably coupled with the PCB, and a pressing portion configured to press the PCB toward the chassis.

In accordance with an aspect of the present disclosure, there is provided a display apparatus including: a display module; a chassis disposed behind the display module to support the display module, and including a plurality of board resting portions; a Printed Circuit Board (PCB) rested on the plurality of board resting portions, and configured to be electrically connected to the display module; a mounting portion formed in at least one board resting portion of the plurality of board resting portions; and a mounting member fixed on the PCB, and removably coupled with the mounting portion by sliding movement of the PCB.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 1 is a perspective view showing a display apparatus according to an embodiment of the present disclosure.

DETAILED DESCRIPTION

Figure 1:
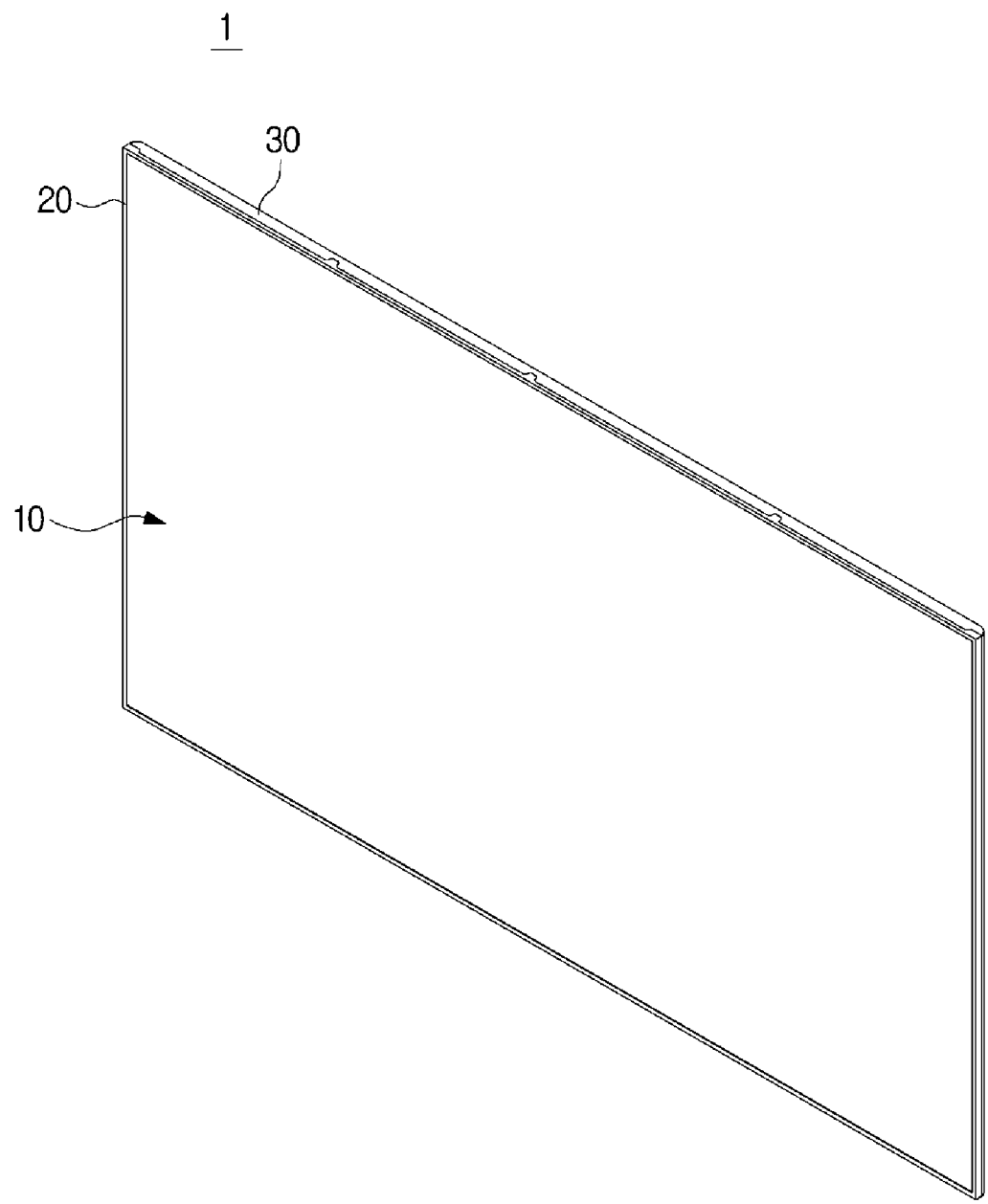
FIG. 1 shows

Reference will now be made in detail to the embodiments, examples of which are illustrated in the accompanying drawings, wherein like reference numerals refer to the like elements throughout. The embodiments are described below by referring to the figures.

Configurations illustrated in the embodiments and the drawings described in the present specification are only the preferred embodiments of the present disclosure, and thus it is to be understood that various modified examples, which may replace the embodiments and the drawings described in the present specification, are possible when filing the present application.

Also, like reference numerals or symbols used in the drawings of the present specification represent members or components performing the substantially same functions.

Also, the terms used in the present specification are used to describe the embodiments of the present disclosure. Accordingly, it should be apparent to those skilled in the art that the following description of exemplary embodiments is provided for illustration purpose only and not for the purpose of limiting the embodiments as defined by the appended claims and their equivalents. It is to be understood that the singular forms "a," "an," and "the" include plural referents unless the context clearly dictates otherwise. In this specification, it will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present disclosure. As used herein, the term "and/or" includes any and all combinations of one or more of associated listed items.

Also, the terms "front end", "rear end", "upper portion", "lower portion", "upper end", and "lower end", when used in this specification, are defined based on the drawings, and the shapes and locations of the corresponding components are not limited by the terms.

Hereinafter, the embodiments of the present disclosure will be described in detail with reference to the accompanying drawings. Hereinafter, a flat panel display apparatus will be described as an embodiment of the present disclosure, however, the present disclosure may also be applied to a curved display apparatus and a bendable or flexible display apparatus that can change its shape between a curved shape and a flat shape.

Also, the present disclosure can be applied to all kinds of electronic products in which a Printed Circuit Board (PCB) is used, as well as a display apparatus.

Figure 2:
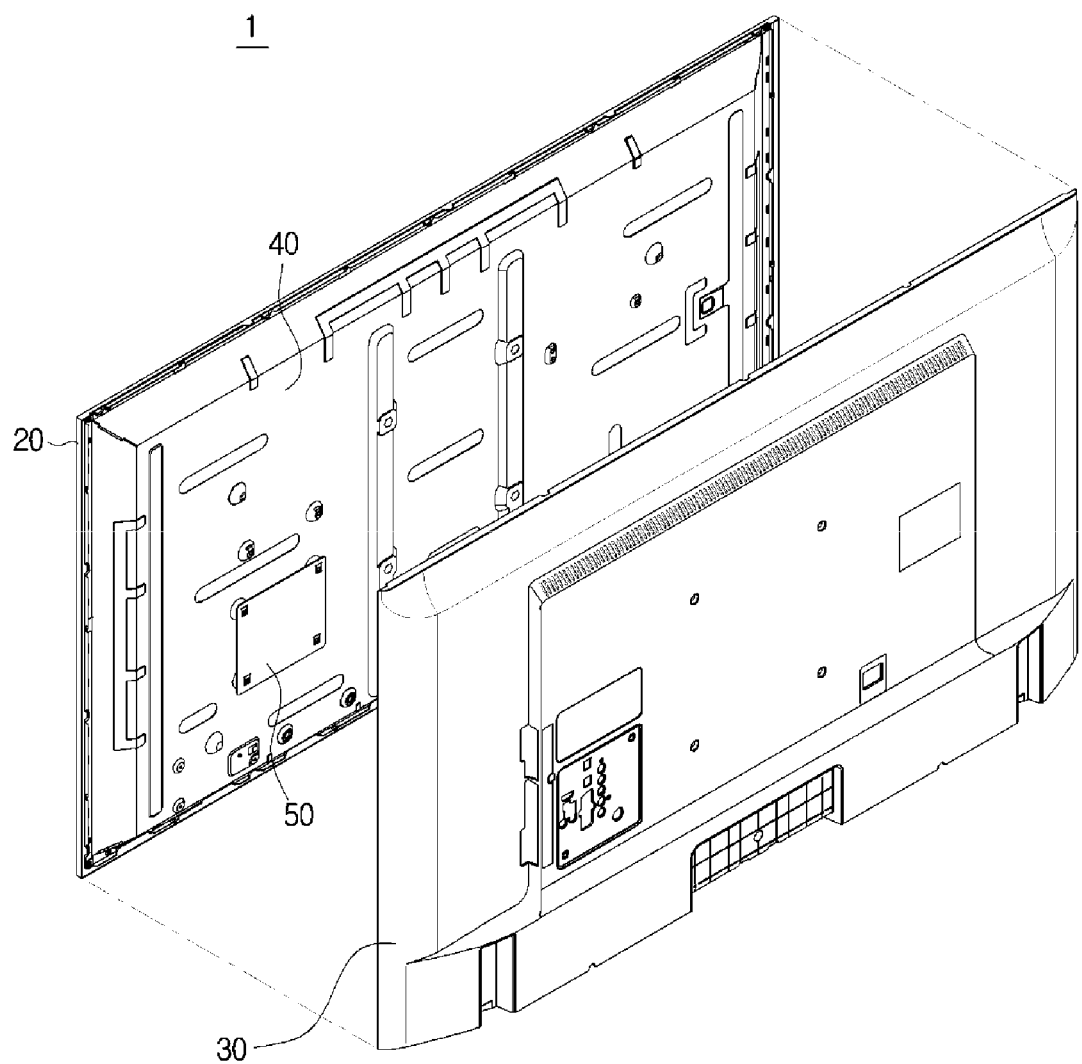
FIG. 2 shows a state in which a rear cover is separated from a chassis, in a display apparatus according to an embodiment of the present disclosure.

FIG. 1 is a perspective view showing a display apparatus according to an embodiment of the present disclosure, and FIG. 2 shows a state in which a rear cover is separated from a chassis, in a display apparatus according to an embodiment of the present disclosure.

As shown in FIG. 1, a display apparatus 1 may include a display module 10 that is in the shape of a flat plate, and a front cover 20 forming the front edges and side appearance of the display apparatus 1.

Also, as shown in FIG. 2, the display apparatus 1 may include a chassis 40 supporting the display module 10, and a rear cover 30 forming the rear appearance of the display apparatus 1.

The display module 10 may include a display panel on which images are displayed, and a backlight unit. The backlight unit may include optical members, such as a light source and a light guide plate. That is, the display module 10 may include, as an edge type backlight unit, a light source disposed behind the display panel, and a light guide plate configured to guide light emitted from the light source to the display panel. The light guide plate may convert light emitted from the light source into surface light, and then cause the surface light to be directed toward the display panel.

The backlight unit may further include an optical member such as a sheet member. The sheet member may include an optical sheet having optical properties, and a Quantum Dot (QD) sheet provided to improve color reproduction.

The chassis 40 may be disposed to support the display module 10. The chassis 40 may include a first chassis (not shown), and a second chassis 40 disposed behind the first chassis. In other words, the first chassis may be disposed on at least one of the front part or sides of the display module 10. For example, the first chassis may be disposed to cover a part of the front surface of the display module 10. Or, the first chassis may be disposed to cover the side surfaces of the display module 10. Or, the first chassis may be disposed to cover a part of the front surface of the display module 10 and the sides of the display module 10. The second chassis 40 may be disposed on at least one of the front part or sides of the display module 10. Preferably, the second chassis 40 may be disposed behind the display module 10. More specifically, if the first chassis is disposed to cover a part of the front surface of the display module 10, the second chassis 40 may be disposed to cover the sides and rear part of the display module 10. If the first chassis is disposed to cover the sides of the display module 10, the second chassis 40 may be disposed behind the display module 10. If the first chassis is disposed to cover a part of the front surface of the display module 10 and the sides of the display module 10, the second chassis 40 may be disposed behind the display module 10. The first chassis may be coupled with the second chassis 40 to support the display module 10. Also, the first chassis and the second chassis 40 may be integrated into one body to support the display module 10.

The rear cover 30 may be disposed behind the second chassis 40 to face the second chassis 40. The rear cover 30 may be disposed behind the second chassis 40 to cover at least one part of the second chassis 40. The rear cover 30 may be removably coupled with the second chassis 40.

The display apparatus 1 may include at least one PCB 50 electrically connected to the display module 10. Referring to FIG. 2, the at least one PCB 50 may be mounted on the chassis 40.

The at least one PCB 50 may include a power board, a signal processing board, a driving board, etc. More specifically, the power board may include a circuit device to supply power to the display module 10. The signal processing board may include a circuit device to receive and process external signals. The driving board may drive the display module 10. The power board, the signal processing board, and the driving board may be disposed independently or agglomerate.

Hereinafter, a structure in which the PCB 50 is mounted on the chassis 40 will be described with reference to the drawings.

Figure 3:
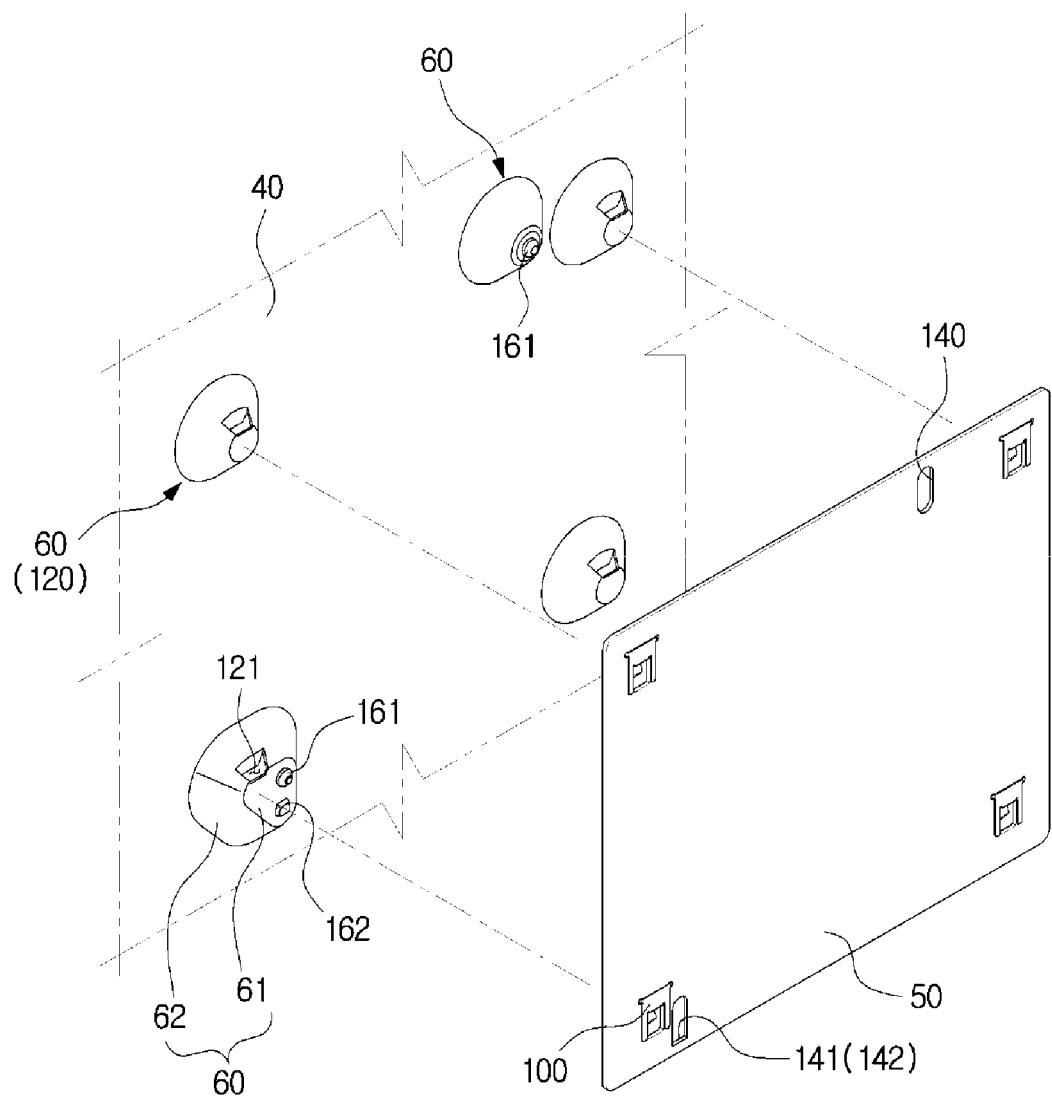
FIG. 3 shows a state in which a PCB is separated from a chassis, in a PCB mounting structure according to an embodiment of the present disclosure.
Figure 4:
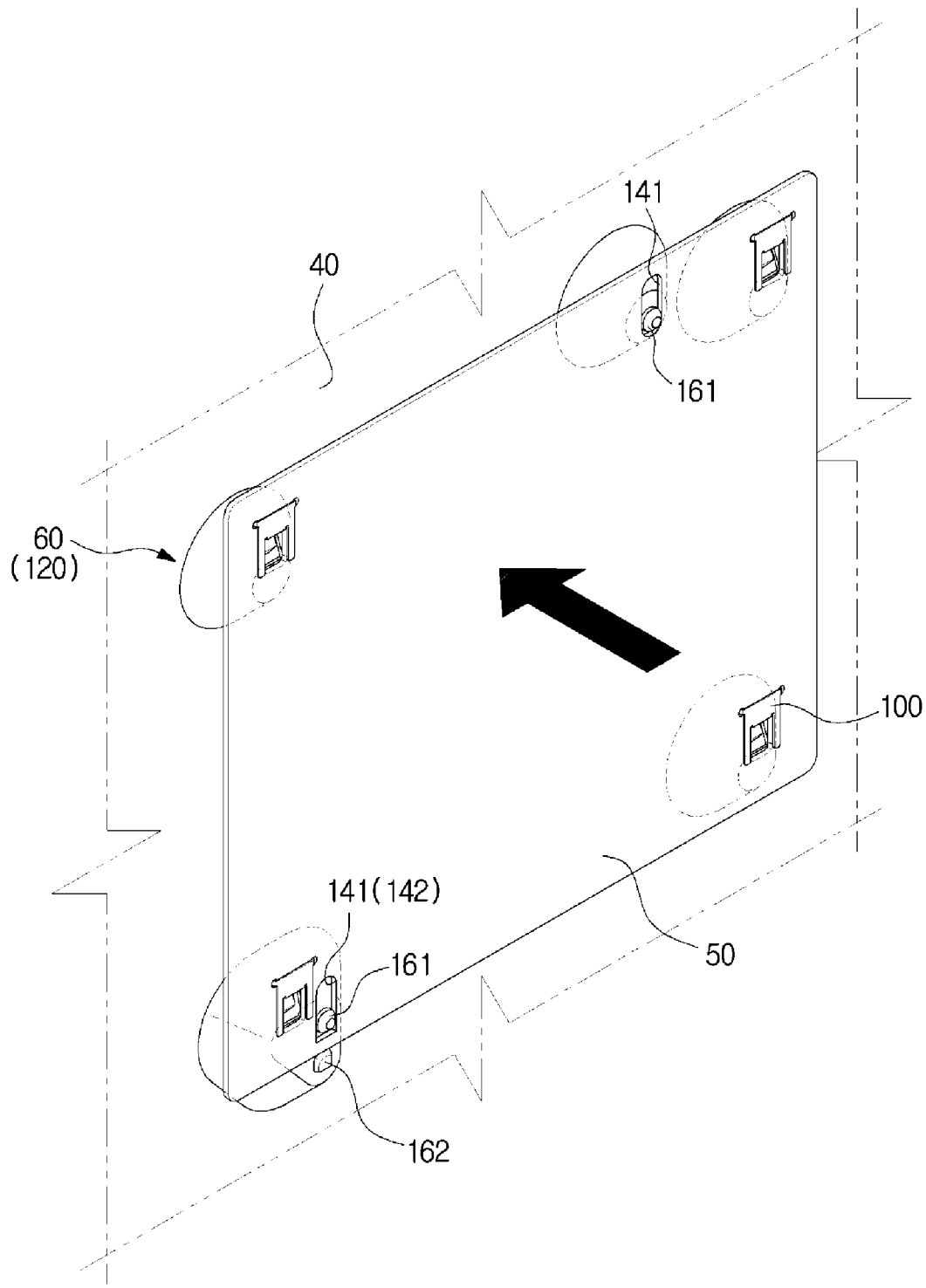
FIG. 4 shows a state in which the PCB is rested on a board resting portion of the chassis, in the PCB mounting structure shown in FIG. 3.
Figure 5:
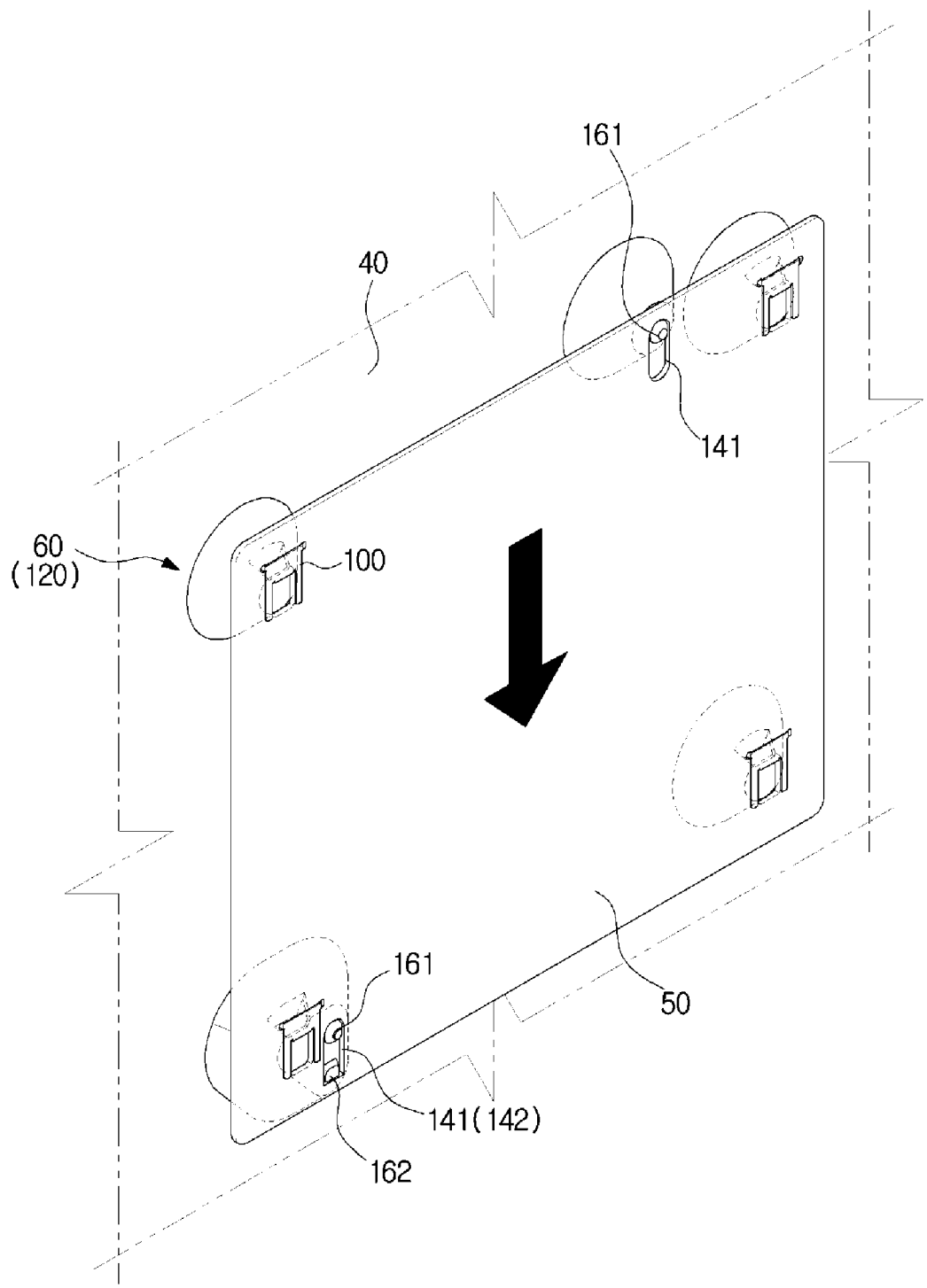
FIG. 5 shows a state in which the PCB is mounted on the chassis, in the PCB mounting structure shown in FIG. 3.
Figure 6:
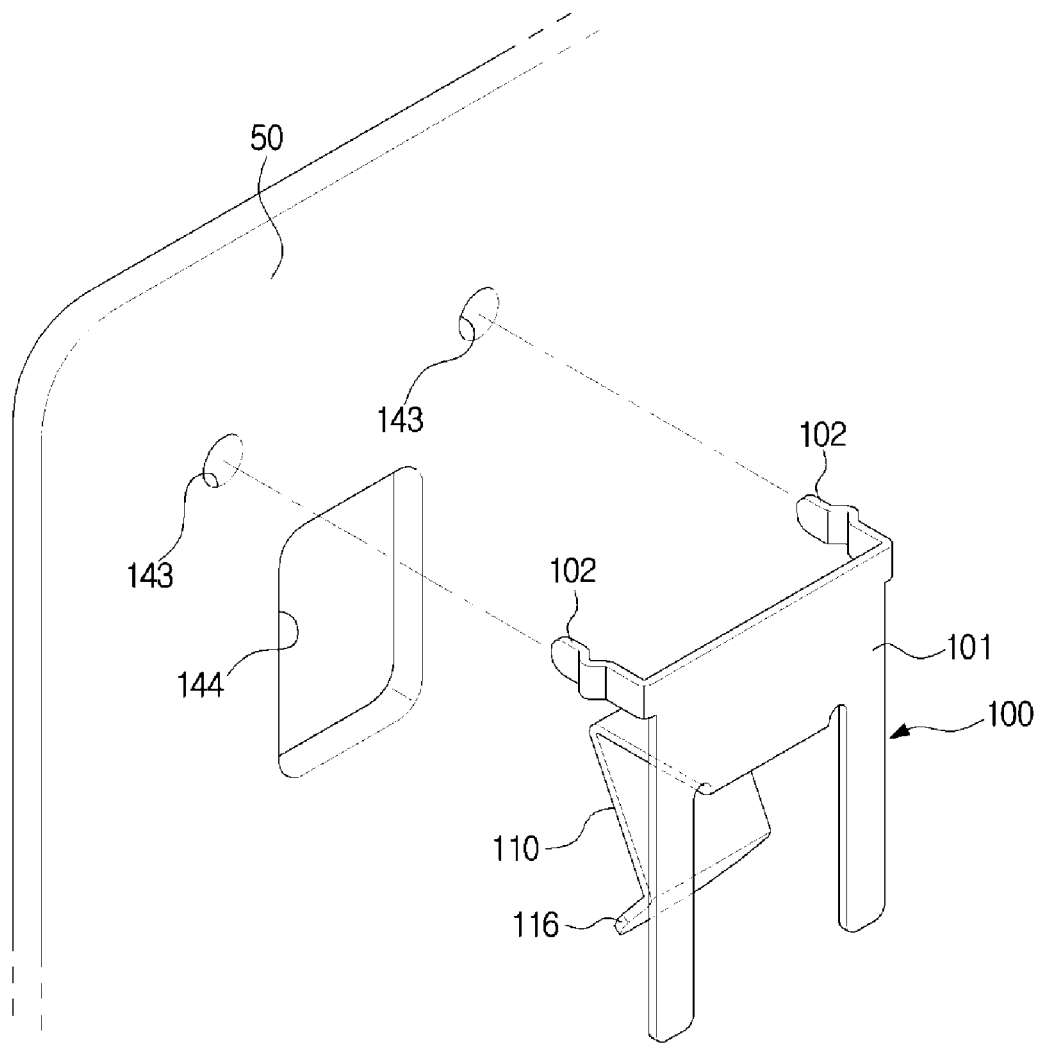
FIG. 6 shows a state in which a mounting member is separated from the PCB, in the PCB mounting structure shown in FIG. 3.

FIG. 3 shows a state in which a PCB is separated from a chassis, in a PCB mounting structure according to an embodiment of the present disclosure, FIG. 4 shows a state in which the PCB is rested on a board resting portion of the chassis, in the PCB mounting structure shown in FIG. 3, FIG. 5 shows a state in which the PCB is mounted on the chassis, in the PCB mounting structure shown in FIG. 3, and FIG. 6 shows a state in which a mounting member is separated from the PCB, in the PCB mounting structure shown in FIG. 3.

Referring to FIGS. 3, 4, and 5, the chassis 40 may include a board resting portion 60 on which the PCB 50 is rested. The chassis 40 and the board resting portion 60 may be formed of a conductive material so that the PCB 50 can be grounded to the chassis 40. The board resting portion 60 may be integrated into the chassis 40, or formed separately from the chassis 40 and then bonded with the chassis 40 in such a way to be electrically connected to the chassis 40. A method of bonding the board resting porting 60 with the chassis 40 in such a way to be electrically connected to the chassis 40 may include welding, adhesion using a conductive adhesive, etc.

The board resting portion 60 may protrude from the chassis 40, and there may be a plurality of board resting portions 60. The top surface 61 of the board resting portion 60 may be flat so that a PCB being a flat plate type can be rested on the board resting portion 60. In a curved display apparatus using a curved chassis, a curved PCB, etc., the top surface 61 of the board resting portion 60 may also be curved, although not shown in the drawings. Since the PCB 50 is rested on the board resting portion 60 protruding from the chassis 40, space may be formed between the PCB 50 and the chassis 40, thereby preventing circuit devices mounted on the PCB 50 from being damaged.

The PCB 50 may be rested on the nest or board resting portion 60, and then slide to be mounted on the chassis 40. In order to the PCB 50 to be easily mounted on the board resting portion 60, a guide protrusion 161 for guiding a resting position or a sliding direction of the PCB 50 may be formed on the top surface 61 of the board resting portion 60.

The PCB 50 may be rested on the board resting portion 60 such that the guide protrusion 161 is accommodated in a guide groove 141 formed in the PCB 50, and then, the PCB 50 may slide such that the guide protrusion 161 moves along the guide groove 141 that is in the shape of a long hole.

Preferably, the PCB 50 may include two or more guide grooves 141. If the PCB 50 is a rectangular flat plate, the guide grooves 141 may be respectively formed in two opposite corners of the PCB 50. More preferably, the guide grooves 141 may be respectively formed in two diagonal corners of the PCB 50.

If the PCB 50 is rested on the board resting portion 60 and then slides, the PCB 50 may be mounted on the chassis 40 by a mounting member 100 provided in the PCB 50. The mounting member 100 may be fixed on the PCB 50, and removably coupled with a mounting portion 120 formed in at least one of the board resting portion 60.

In the inside of the board resting portion 60, a cavity may be formed. The mounting portion 120 formed in the at least one board resting portion 60 may include an insertion hole 121 formed in the inclined surface 62 of the board resting portion 60. A spring or coupling portion 110 of the mounting member 100, which is inserted into the insertion hole 121 of the mounting portion 120, may be accommodated in the inside of the mounting portion 120, that is, the cavity of the board resting portion 60 to thus elastically support or push against an area of the inner surface of the board resting portion 60.

Referring to FIG. 6, the PCB 50 may include an installation hole 143 in which the mounting member 100 is installed. The mounting member 100 may include a support portion 101 rested and supported on the PCB 50, and a lead 102 protruding from the support portion 101 and inserted into the installation hole 143 of the PCB 50.

The mounting member 100 may include a conductive material, and at least one of the support portion 101 and the lead 102 may be bonded with the PCB 50 by a conductive material so as to be electrically connected to the PCB 50.

The PCB 50 may include a through hole 144 through which the coupling portion 110 of the mounting member 100 can pass. The support portion 101 of the mounting member 100 may be supported on one surface of the PCB 50, and the coupling portion 110 protruding from the support portion 101 may pass through the through hole 144 formed in the PCB 50 to protrude from the other surface of the PCB 50.

The coupling portion 110 of the mounting member 100 may include a first part 111 extending vertically from the support portion 101, and a second part 112 extending from the first part 111 and inserted in the insertion hole 121 of the mounting portion 120.

The second part 112 of the coupling portion 110 of the mounting member 100 may include a guide section 113 to facilitate insertion into the insertion hole 121, and a spring or a pressing section 114 to press an area of the inner surface of the mounting portion 120 when the second part 112 is inserted in the insertion hole 121. The pressing section 114 may extend from the first part 111 such that the second part 112 of the coupling portion 110 is inclined toward the support portion 101, and the guide section 113 may extend from the end of the pressing section 114 such that the second part 112 is inclined toward a direction that is far away from the support portion 101.

The guide section 113 of the coupling portion 110 may extend to a predetermined length to guide the coupling portion 110 to be easily inserted in the insertion hole 121, even when the PCB 50 is not kept close to the board resting portion 60 due to any deformation although it is rested on the board resting portion 60.

Since foreign materials such as dust may enter the inside of the chassis 40 through the insertion hole 121 formed in the mounting portion 120, the first part 111 of the coupling portion 110 of the mounting member 100 may include a closing section 115 for closing the insertion hole 121. More specifically, the coupling portion 110 of the mounting member 100 may be formed with a width corresponding to that of the insertion hole 121 of the mounting portion 120, so that the closing section 115 of the first part 111 of the coupling portion 110 can close the insertion hole 121 when the coupling portion 110 is inserted in the insertion hole 121.

A chamfer 116 may be formed at the end of the guide section 113, so that the coupling portion 110 can be easily inserted into the insertion hole 121 by the guide section 113 although the coupling portion 110 is formed to correspond to the width of the insertion hole 121.

Referring to FIGS. 3 to 6, if the PCB 50 slides so that the coupling portion 110 of the mounting member 100 is completely inserted in the insertion hole 121 of the mounting portion 120, the PCB 50 may be mounted on the chassis 40. A stopper 162 may be formed on the at least one board resting portion 60, in order to prevent the PCB 50 mounted at a predetermined position on the chassis 40 from escaping from the chassis 40.

The stopper 162 may protrude from the top surface 61 of the board resting portion 60, like the guide protrusion 161, and the PCB 50 may include a stopper accommodating groove 142. If the stopper 162 is inserted in the stopper accommodating groove 142, the stopper 162 cannot move in the stopper accommodating groove 142, unlike the guide groove 141.

The stopper 162 and the guide protrusion 161 may be formed on the top surface 61 of the same board resting portion 60, and in this case, the guide groove 141 and the stopper accommodating groove 142 may be the same groove. That is, if the guide protrusion 161 moves from one end to the other end of the guide groove 141 by the sliding movement of the PCB 50, the stopper 162 may be accommodated in the one end of the guide groove 141 and supported.

Although not shown in the drawings, the mounting portion 120 may also be disposed on the top surface 61 of the same board resting portion 60 on which the stopper 162 and/or the guide protrusion 161 is formed.

As shown in FIG. 2, when the PCB 50 is mounted on the chassis 40 in a direction that is vertical to the ground in an electronic product such as the display apparatus 1, the PCB 50 may be mounted on the chassis 40 by sliding in a down direction in consideration of gravity.

In the PCB mounting structure according to an embodiment of the present disclosure, it is possible to change the design of the mounting portion 120 such that the mounting member 100 can be applied to all of the chassis 40 or the board resting portion 60 formed of materials having various thicknesses and the PCB 50 having various thicknesses.

Figure 7:
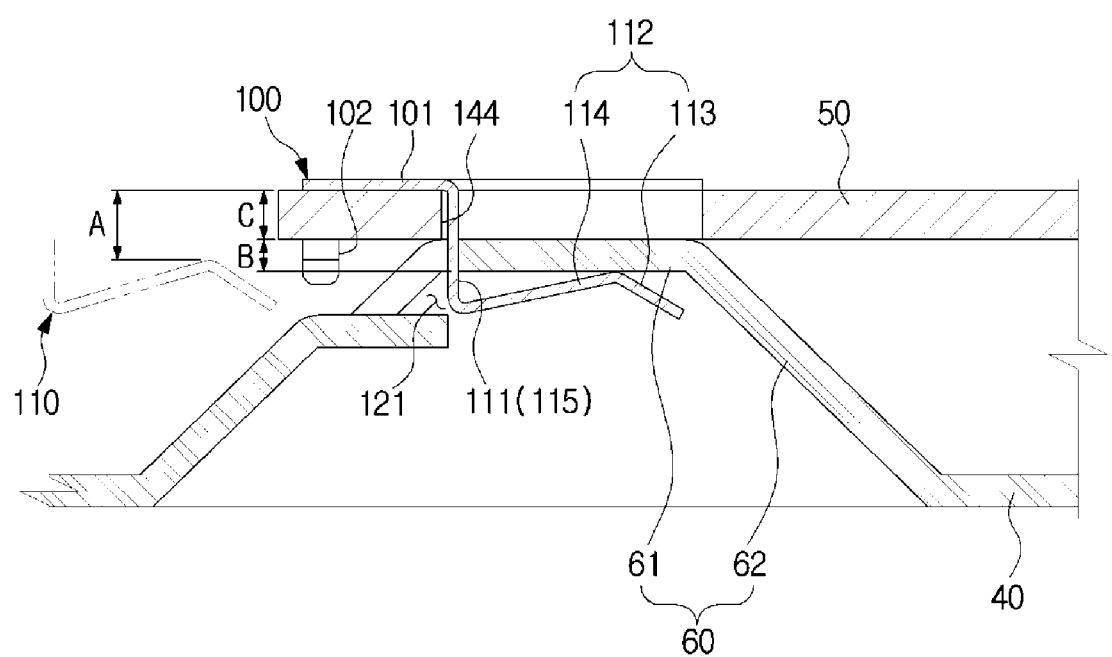
FIG. 7 is a cross-sectional view showing an assembled state of a mounting member and a mounting portion in the PCB mounting structure shown in FIG. 3.
Figure 8:
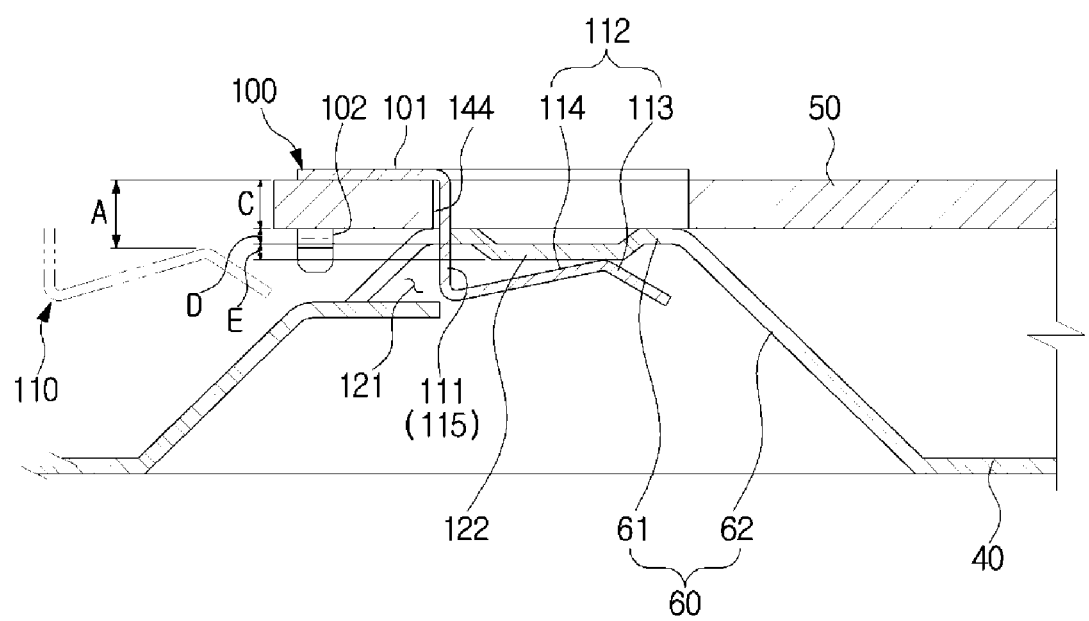
FIG. 8 is a cross-sectional view showing an assembled state of a mounting member and a mounting portion in the PCB mounting structure shown in FIG. 3.
Figure 9:
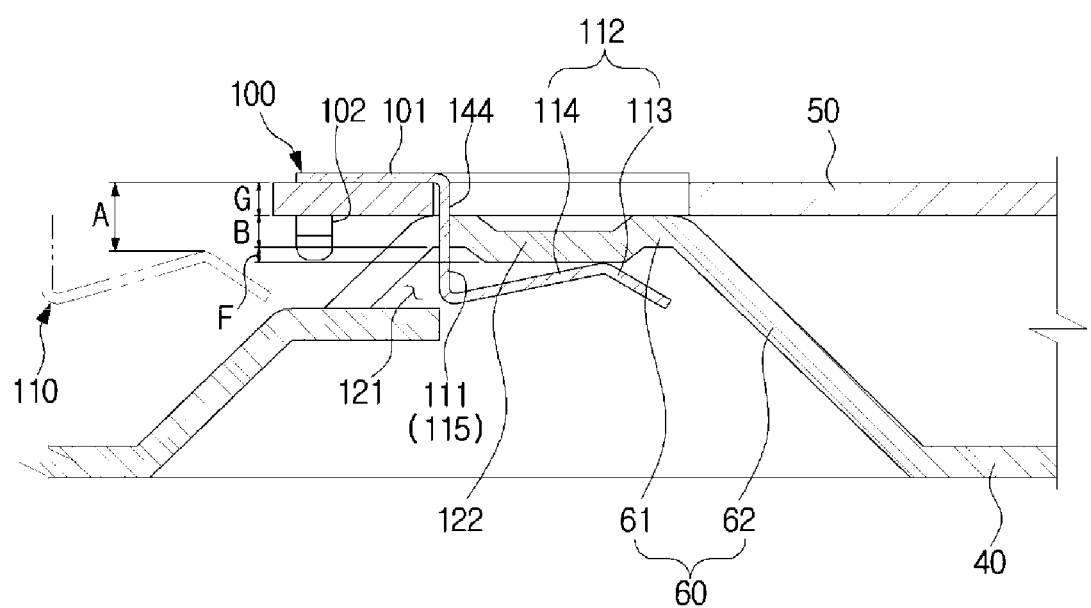
FIG. 9 is a cross-sectional view showing an assembled state of a mounting member and a mounting portion in the PCB mounting structure shown in FIG. 3.

FIGS. 7, 8, and 9 are cross-sectional views showing an assembled state of a mounting member and a mounting portion in the PCB mounting structure shown in FIG. 3.

FIG. 7 shows an assembled state of the mounting member 100 and the mounting portion 120 when the designs of the mounting member 100 and the mounting portion 120 do not change. A minimum distance A between the support portion 101 and the coupling portion 110 of the mounting member 100, that is, a distance A between the support portion 101 and the upper surface of the pressing section 114 when the coupling portion 110 of the mounting member 100 is not inserted in the insertion hole 121 of the mounting portion 120 may be smaller than a sum of the thickness B of the top portion of the board resting portion 60 on which the mounting portion 120 is disposed and the thickness C of the PCB 50.

Accordingly, when the mounting member 100 is coupled with the mounting portion 120, the coupling portion 110 of the mounting member 100 may be elastically deformed so that the pressing section 114 presses an area of the inner surface of the mounting portion 120 by a restoring force to generate a clamping force of the mounting member 100. Also, due to contact of the mounting member 100 with the mounting portion 120, Electro Magnetic Interference (EMI) grounding between the PCB 50 and the chassis 40 is possible.

FIG. 8 shows the mounting portion 120 subjected to a change of design such that the mounting member 100 of FIG. 7 can be applied in the same manner to the mounting portion 120, when the thickness D of the board resting portion 60 is thinner than the thickness B of the board resting portion 60 of FIG. 7.

Since the minimum distance A between the support portion 101 and the coupling portion 110 of the mounting member 100 and the thickness C of the PCB 50 are the same as in the embodiment of FIG. 7, a thickness E corresponding to a difference between the thickness B of the board resting portion 60 of FIG. 7 and the thickness D of the board resting portion 60 of FIG. 8 may need to be compensated, in order to generate the same fastening force as in the embodiment of FIG. 7 between the mounting member 100 and the mounting portion 120 of FIG. 8.

Accordingly, the mounting portion 120 may include a thickness forming portion 122, in the area of the inner surface of the mounting portion 120, pressed by the pressing section 114 of the mounting member 100, wherein the thickness forming portion 122 may protrude toward the inside of the mounting portion 120. That is, in the top portion of the board resting portion 60, the thickness forming portion 122 may be formed in such a way to protrude toward the inside of the board resting portion 60 by the thickness E corresponding to the difference between the thickness B of the board resting portion 60 of FIG. 7 and the thickness D of the board resting portion 60 of FIG. 8.

The thickness forming portion 122 formed in the mounting portion 120 may be applied to the PCB 50 having a thin thickness.

FIG. 9 shows the mounting portion 120 subjected to a change of design such that the mounting member 100 of FIG. 7 can be applied in the same manner to the mounting portion 120 when the thickness of the PCB 50 is thinner than the thickness C of the PCB 50 of FIG. 7.

Since the minimum distance A between the support portion 101 and the coupling portion 110 of the mounting member 100 and the thickness B of the top portion of the mounting portion 120 are the same as in the embodiment of FIG. 7, a thickness F (C−G=F) corresponding to a difference between the thickness C of the PCB 50 of FIG. 7 and the thickness G of the PCB 50 of FIG. 9 may need to be compensated, in order to generate the same fastening force as in the embodiment of FIG. 7 between the mounting member 100 and the mounting portion 120 of FIG. 9.

Accordingly, like the embodiment of FIG. 8, the mounting portion 120 of FIG. 9 may include a thickness forming portion 122, in the area of the inner surface of the mounting portion 120, pressed by the pressing section 114 of the mounting member 100, wherein the thickness forming portion 122 may protrude toward the inside of the mounting portion 120.

In the PCB mounting structure according to another embodiment of the present disclosure, it is possible to change the designs of the mounting member 100 and the PCB 50 such that the mounting member 100 can be applied to all of the chassis 40 or the board resting portion 60 formed of materials having various thicknesses and the PCB 50 having various thicknesses.

Figure 10:
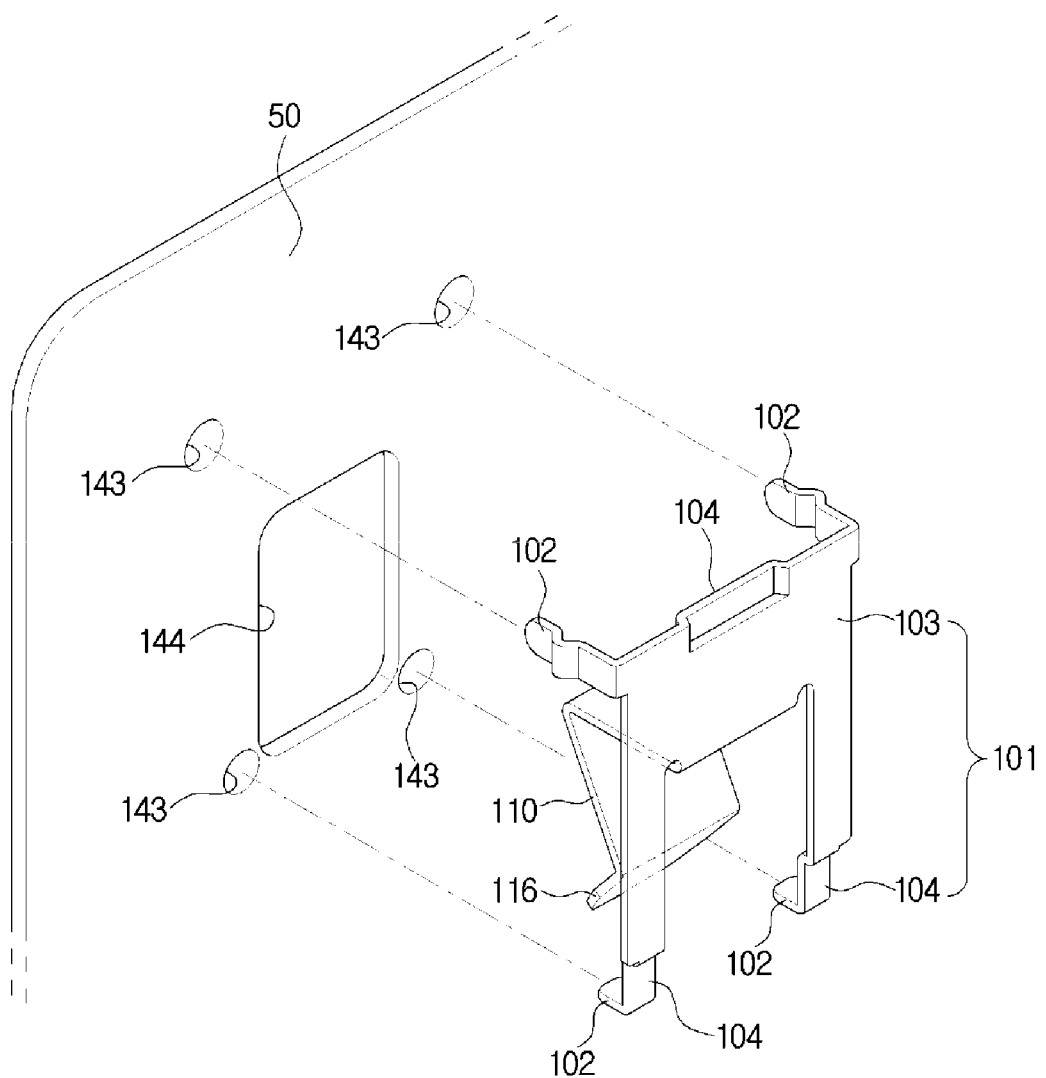
FIG. 10 shows a state in which a mounting member is separated from a PCB, in a PCB mounting structure according to another embodiment of the present disclosure.
Figure 11:
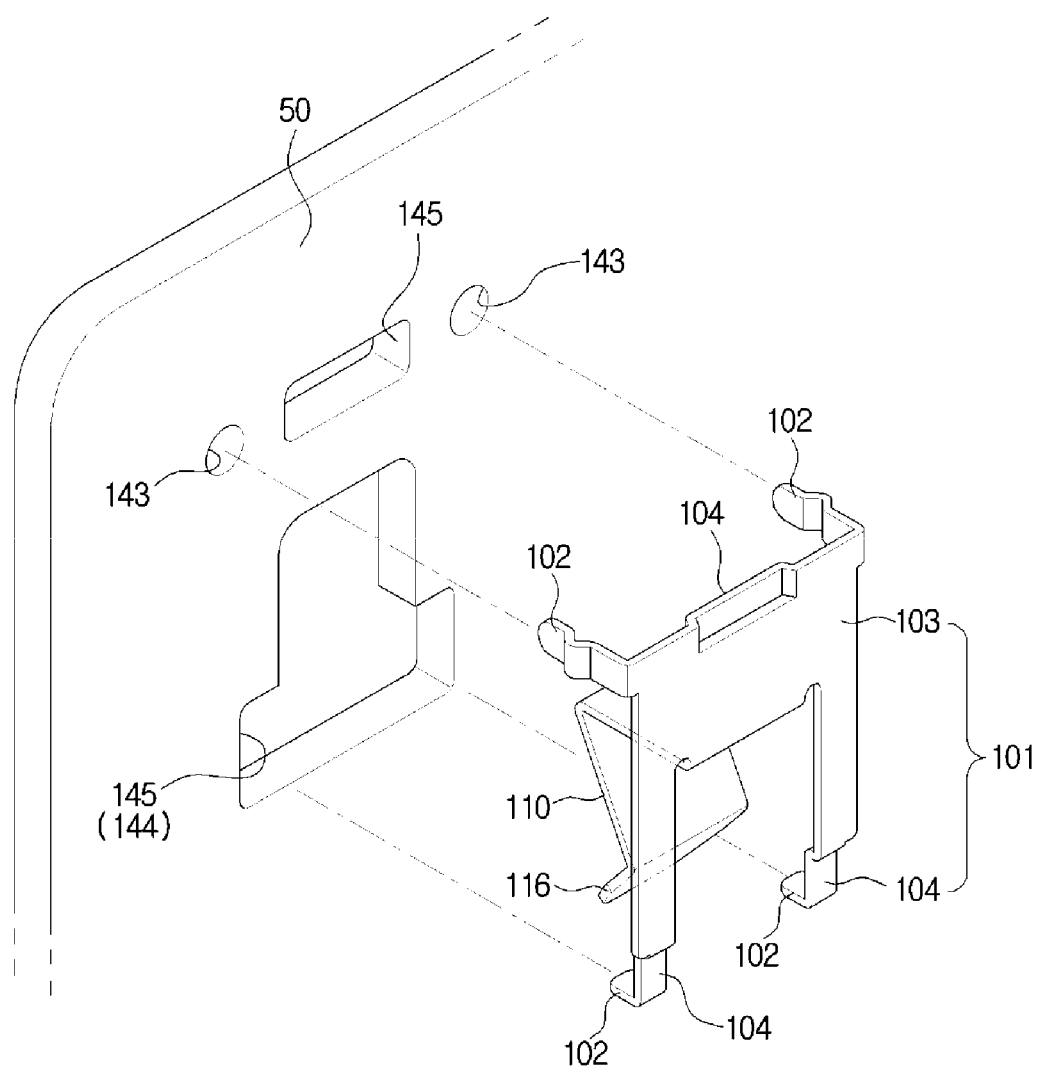
FIG. 11 shows a state in which a mounting member is separated from a PCB, in a PCB mounting structure according to another embodiment of the present disclosure.
Figure 12:
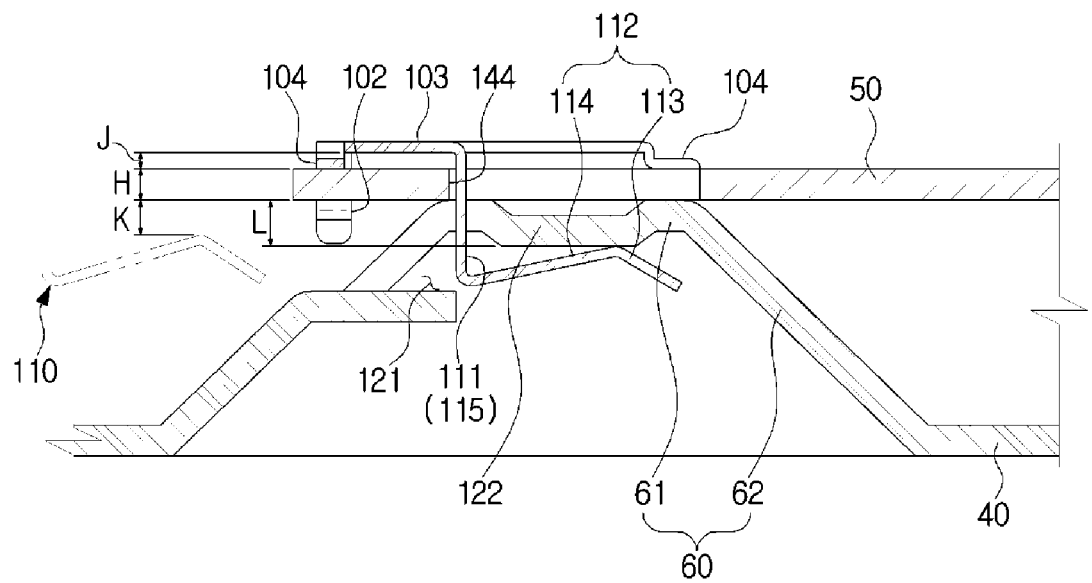
FIG. 12 shows an assembled state of the mounting member and a mounting portion, in the PCB mounting structure shown in FIG. 10.
Figure 13:
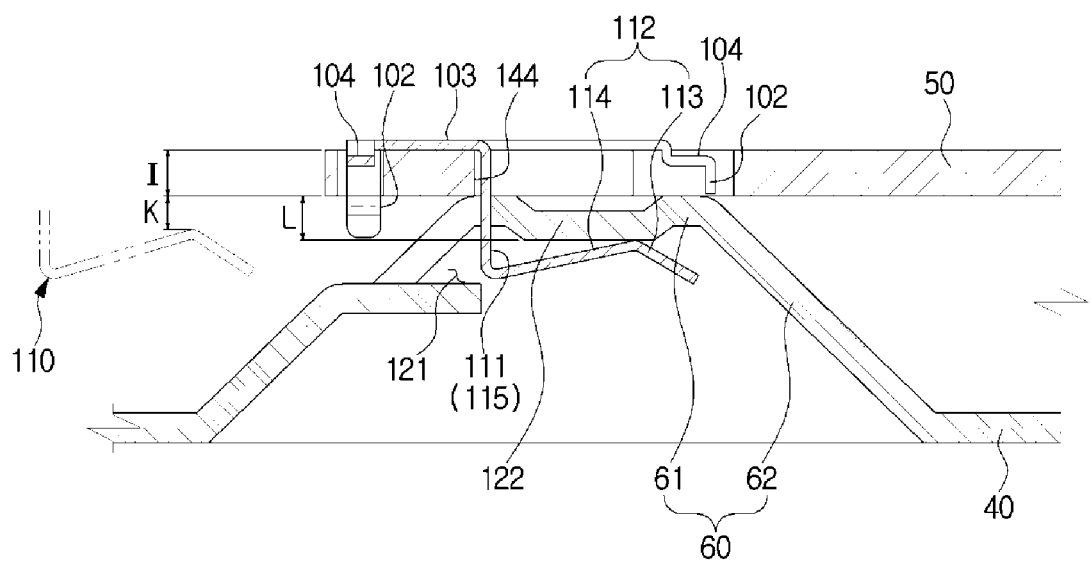
FIG. 13 is a cross-sectional view showing an assembled state of the mounting member and a mounting portion in the PCB mounting structure shown in FIG. 11.

FIG. 10 shows a state in which a mounting member is separated from a PCB, in a PCB mounting structure according to another embodiment of the present disclosure, FIG. 11 shows a state in which a mounting member is separated from a PCB, in a PCB mounting structure according to another embodiment of the present disclosure, FIG. 12 shows an assembled state of the mounting member and a mounting portion, in the PCB mounting structure shown in FIG. 10, and FIG. 13 is a cross-sectional view showing an assembled state of the mounting member and a mounting portion in the PCB mounting structure shown in FIG. 11.

Referring to FIGS. 10 to 13, the support portion 101 of the mounting member 100 may have a two-step structure. More specifically, the support portion 101 of the mounting member 100 may include a first support section 103, and a second support section 104 protruding toward the PCB 50 from the first support section 103.

The thickness H of the PCB 50 shown in FIG. 10 may be thinner than the thickness I of the PCB 50 shown in FIG. 11, and accordingly, the second support section 104 protruding to a height J corresponding to a difference between the thickness H of the PCB 50 of FIG. 12 and the thickness I of the PCB 50 of FIG. 13 may be supported on the PCB 50 so as to compensate for the thickness difference J.

Also, since the PCB 50 of FIG. 11 is thicker than the PCB 50 of FIG. 10, the protruding second support section 104 of the support portion 101 of the mounting member 100 may be accommodated in a support portion accommodating groove 145 formed in the PCB 50, so that the mounting member 100 can be supported on the PCB 50 by the second support section 104.

Referring to FIGS. 12 and 13, since the mounting member 100 includes the first support section 103 and the second support section 104, a minimum distance K between the PCB 50 and the coupling portion 110 of the mounting member 100 can be maintained although the thickness of the PCB 50 changes. If a distance L between the top surface 61 of the board resting portion 60 and the inner surface of the board resting portion 60 on which the coupling portion 110 is supported is constant although the thickness of the PCB 50 changes, the same fastening force can be generated between the mounting member 100 and the mounting portion 120.

Hereinafter, a PCB mounting structure according to another embodiment of the present disclosure will be described with reference to FIGS. 14, 15, and 16.

Figure 14:
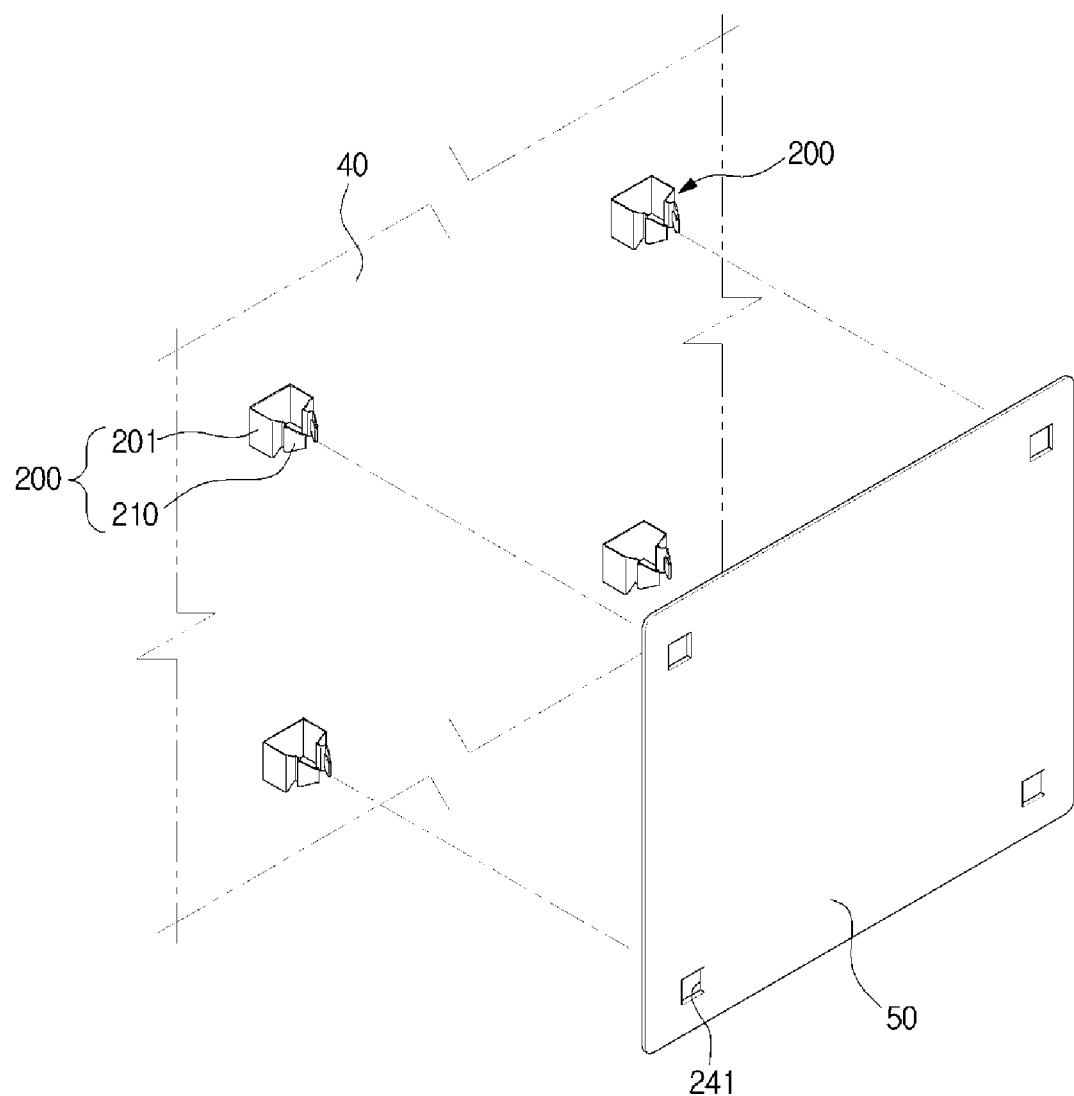
FIG. 14 shows a state in which a PCB is separated from a chassis, in a PCB mounting structure according to another embodiment of the present disclosure.
Figure 15:
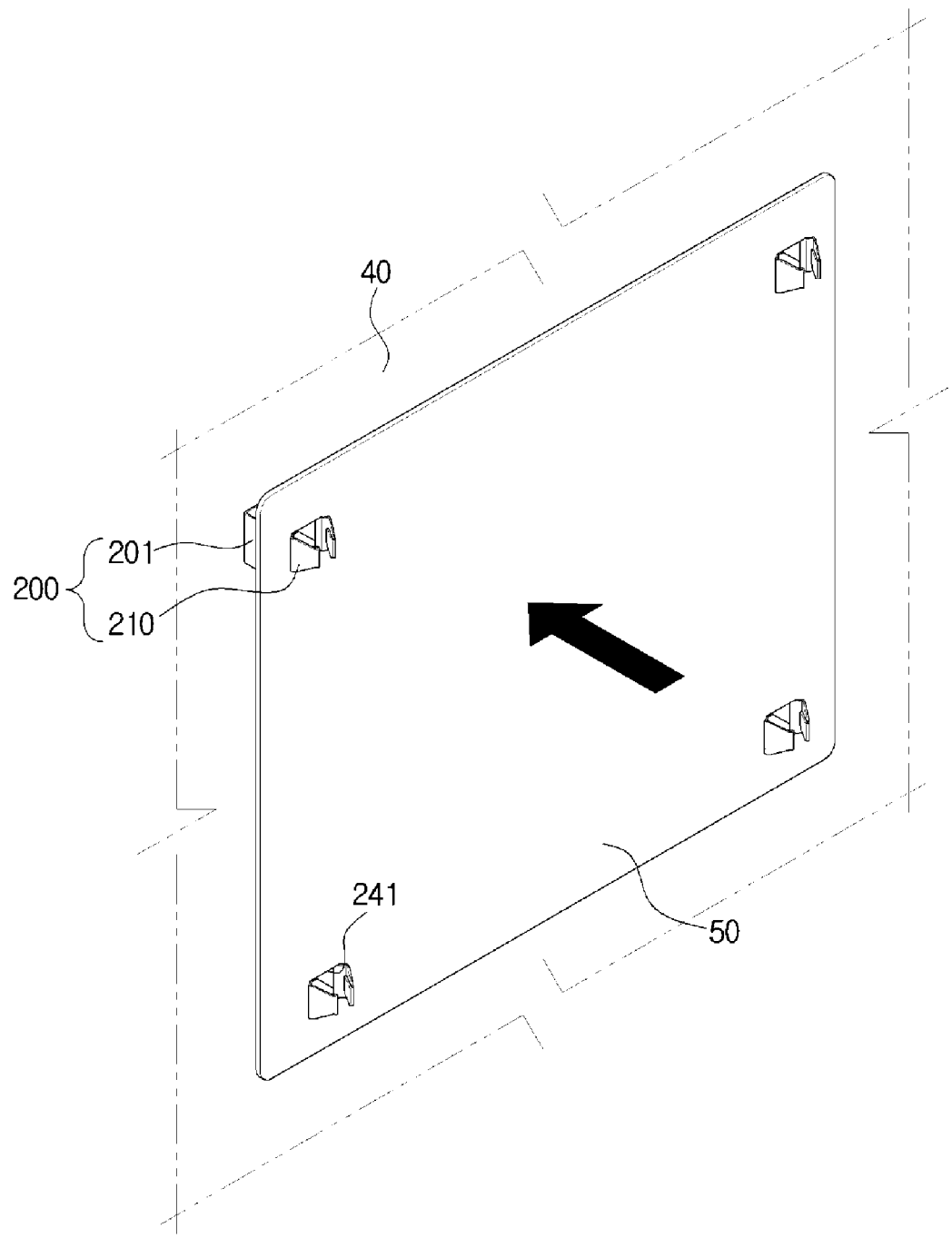
FIG. 15 shows a state in which the PCB is mounted on the chassis, in the PCB mounting structure shown in FIG. 14.
Figure 16:
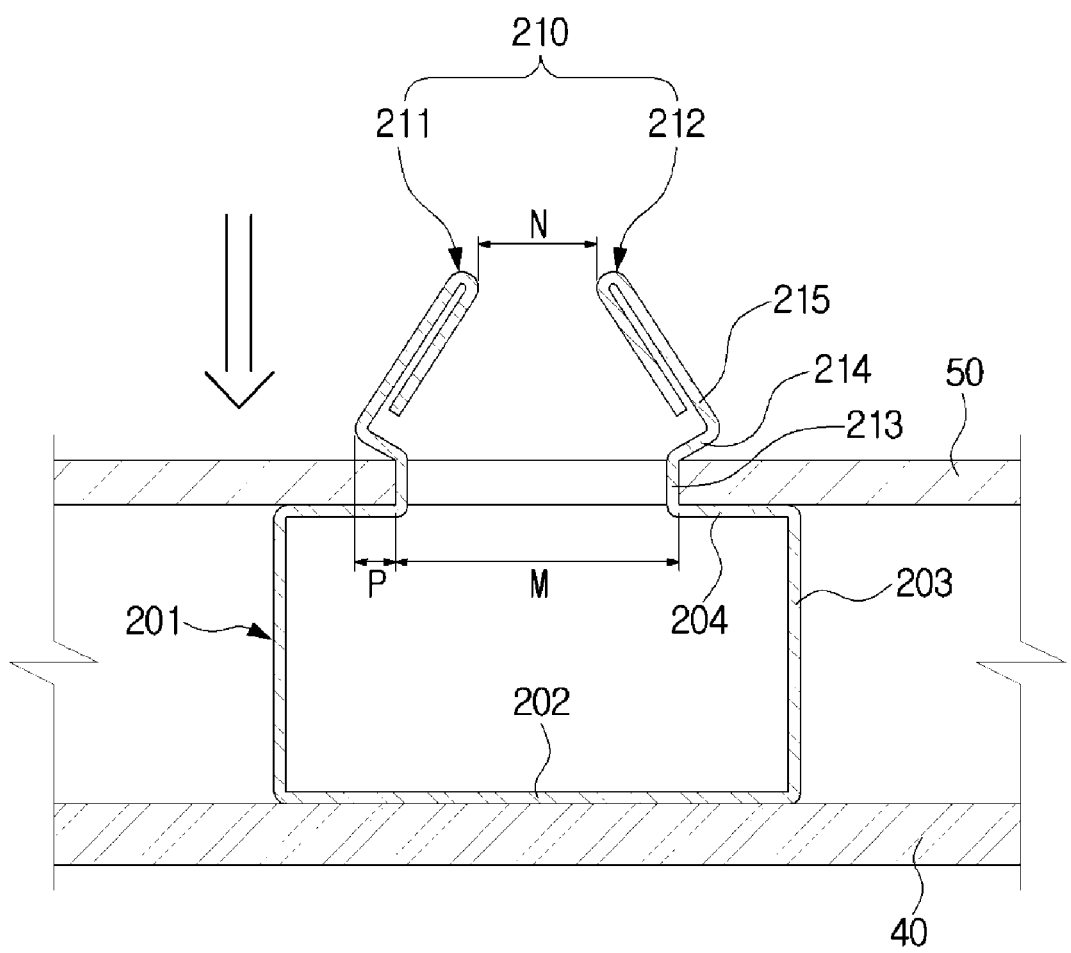
FIG. 16 is a cross-sectional view showing an assembled state of the PCB and the chassis, in the PCB mounting structure shown in FIG. 14.

FIG. 14 shows a state in which a PCB is separated from a chassis, in a PCB mounting structure according to another embodiment of the present disclosure, FIG. 15 shows a state in which the PCB is mounted on the chassis, in the PCB mounting structure shown in FIG. 14, and FIG. 16 is a cross-sectional view showing an assembled state of the PCB and the chassis, in the PCB mounting structure shown in FIG. 14.

Referring to FIGS. 14, 15, and 16, the chassis 40 may include a mounting member 200 that can be coupled with the PCB 50 by a snap button method. The PCB 50 may include a through hole 241 through which the mounting member 200 can be coupled. The mounting member 200 may include a support portion 201 bonded on the chassis 40, and a coupling portion 210, having opposing spring member which extends from the support portion 201 and which can be inserted in the through hole 241 of the PCB 50.

The support portion 201 of the mounting member 200 may include a lower surface 202 bonded on the chassis 40, and an upper surface 204 spaced by a predetermined distance from the lower surface 202 with a side surface 203 in between, wherein the PCB 50 is rested on the upper surface 204. The mounting member 200 may include a conductive material, and the lower surface 202 of the support portion 201 may be bonded with the chassis 40 in such a way to be electrically connected to the chassis 40.

The coupling portion 210 of the mounting member 200 may protrude from the upper surface 204 of the support portion 201, and include a first coupling section 211 and a second coupling section 212 that are symmetrical to each other. The first coupling section 211 and the second coupling section 212 may be spaced from each other to correspond to the width M of the through hole 241, and each of the first coupling section 211 and the second coupling section 212 may include a first part 213 extending from the upper surface 204 of the support portion 201 by a length corresponding to the thickness of the PCB 50.

Also, each of the first coupling section 211 and the second coupling section 212 may include a second part 214 extending from the first part 213 in such a way to be inclined with respect to the first part 213 so that the distance between the first coupling section 211 and the second coupling section 212 can become wider than the width M of the through hole 241.

Also, each of the first coupling section 211 and the second coupling section 212 may include a third part 215 extending from the second part 214 in such a way to be inclined with respect to the second part 214 so that the distance between the first coupling section 211 and the second coupling section 212 can become narrower than the width M of the through hole 241.

A distance N between the end of the third part 215 of the first coupling section 211 and the end of the third part 215 of the second coupling section 212 may be wider than a sum of the horizontal lengths P of the second parts 214, so that the coupling portion 210 of the mounting member 200 can be easily inserted into the through hole 241 of the PCB 50 by the elastic deformation.

If the coupling portion 210 of the mounting member 200 is inserted into the through hole 241 of the PCB 50, the mounting member 200 can be prevented from escaping from the through hole 241 of the PCB 50 by the upper surface 204 of the support portion 201, and the first and second parts 213 and 214 of the coupling portion 210.

Also, when the PCB 50 is detached from the chassis 40, the third parts 215 of the mounting member 200 may be pressed toward the center of the first coupling section 211 and the second coupling section 212 so that the PCB 50 can be easily decoupled with the chassis 40 by the elastic deformation of the coupling portion 210.

Hereinafter, a PCB mounting structure according to another embodiment of the present disclosure will be described with reference to FIGS. 17 to 21.

Figure 17:
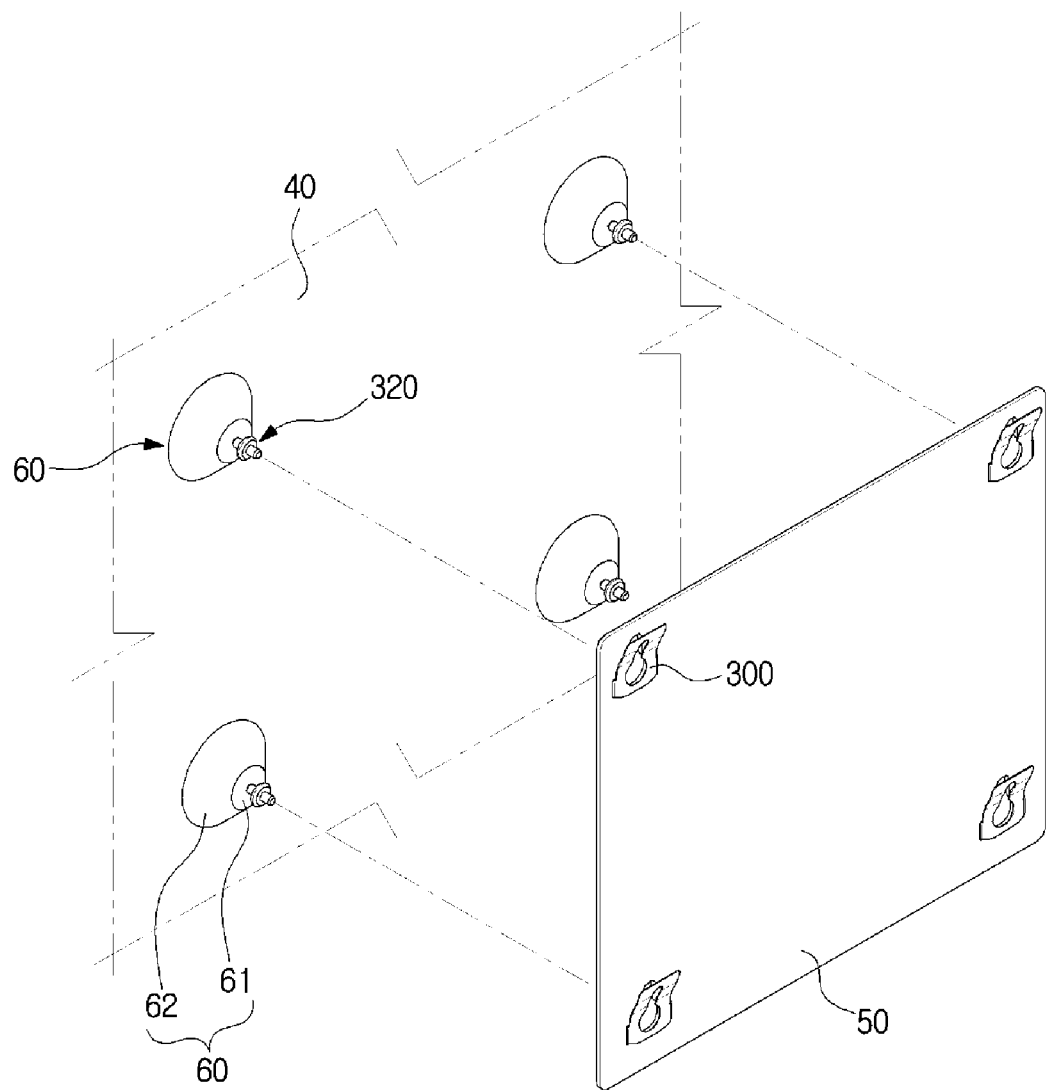
FIG. 17 shows a state in which a PCB is separated from a chassis, in a PCB mounting structure according to another embodiment of the present disclosure.
Figure 18:
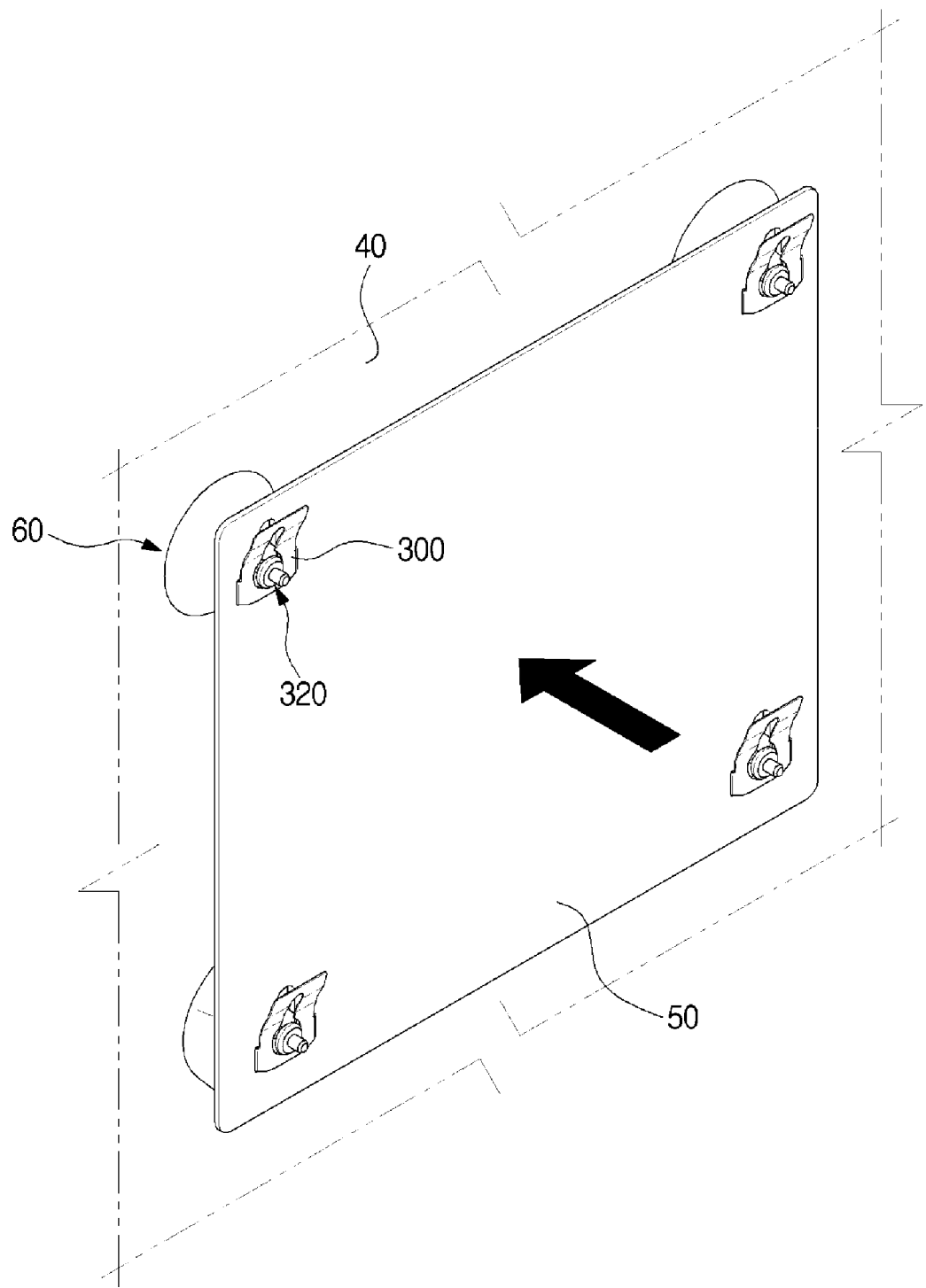
FIG. 18 shows a state in which the PCB is rested on a board resting portion of the chassis, in the PCB coupling structure shown in FIG. 17.
Figure 19:
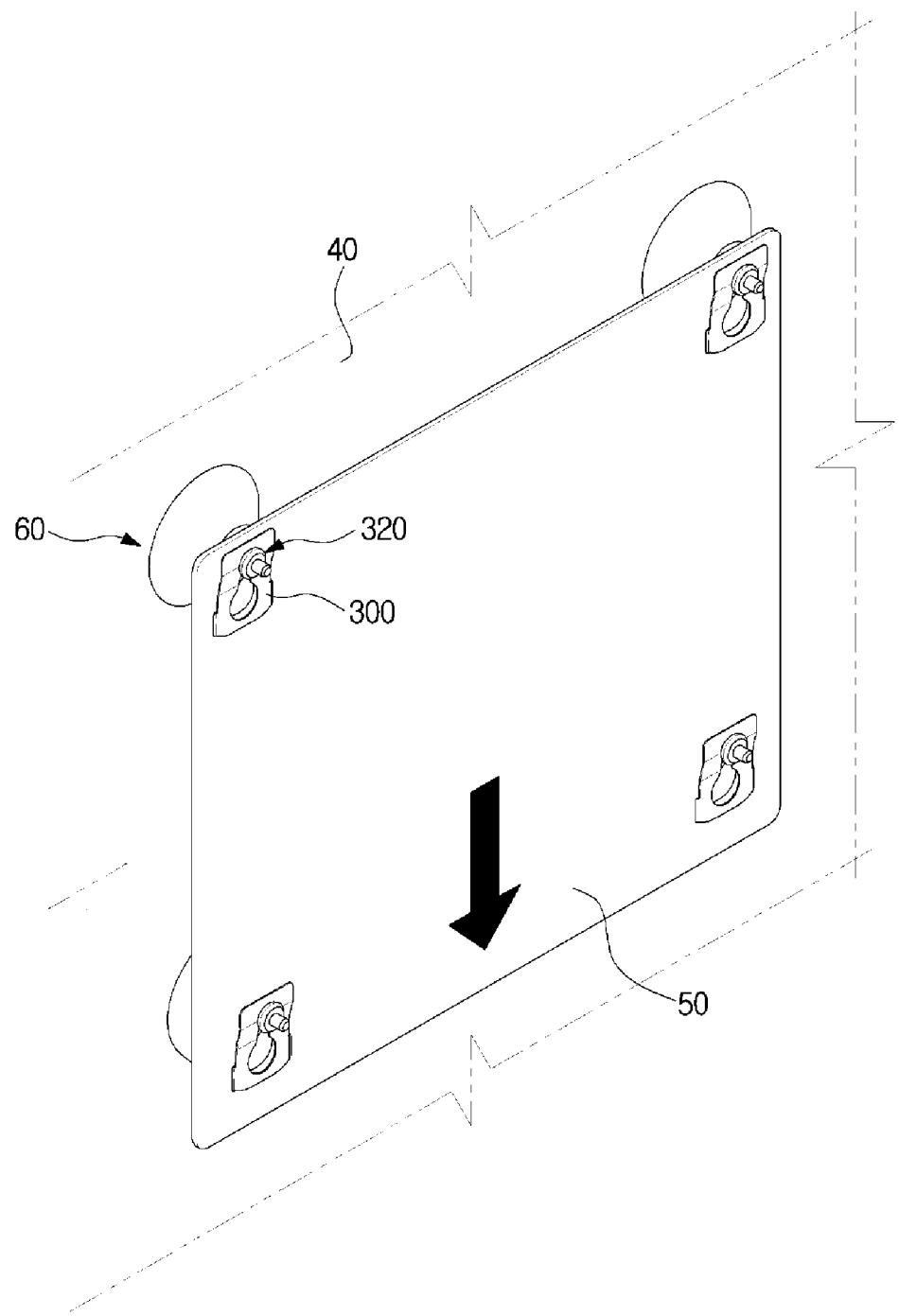
FIG. 19 shows a state in which the PCB is mounted on the chassis, in the PCB mounting structure shown in FIG. 17.
Figure 20:
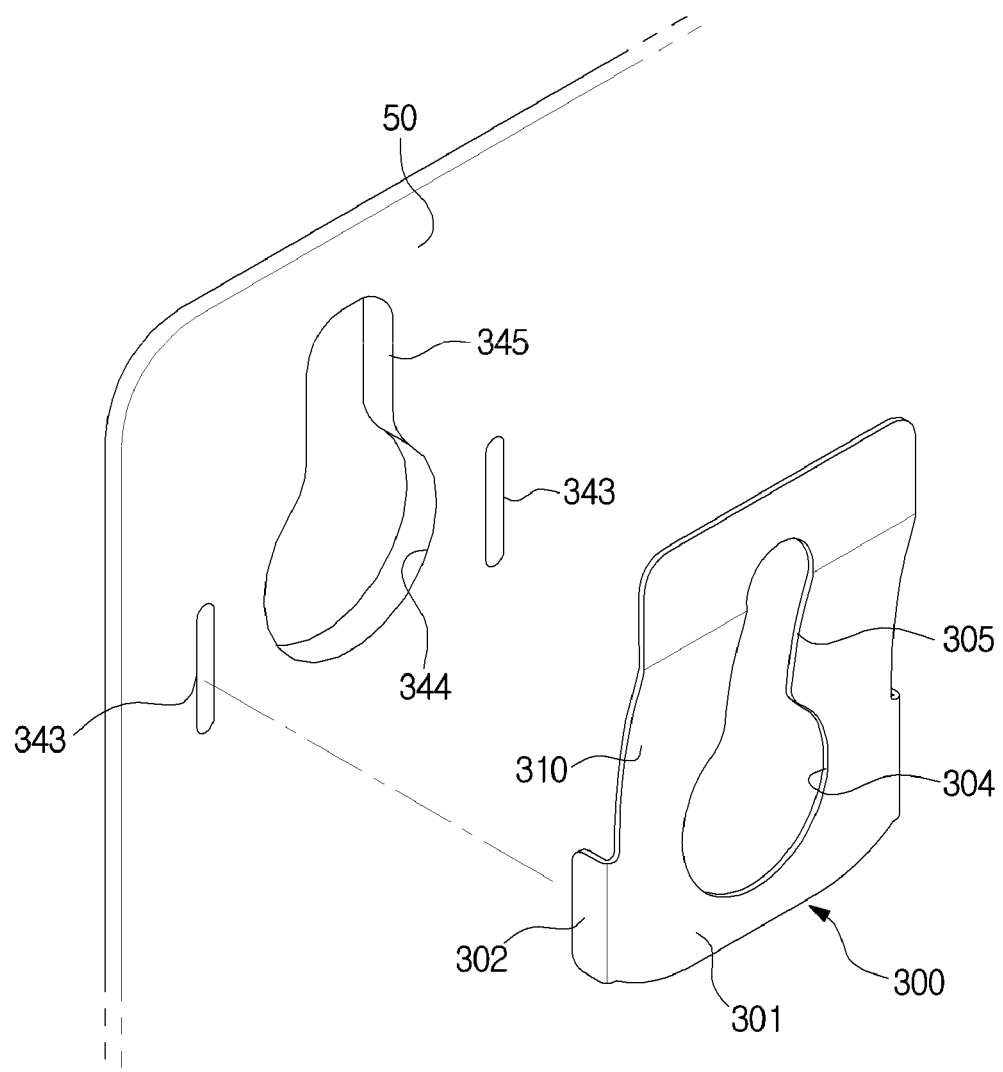
FIG. 20 shows a state in which the PCB is separated from a mounting member, in the PCB mounting structure shown in FIG. 17.
Figure 21:
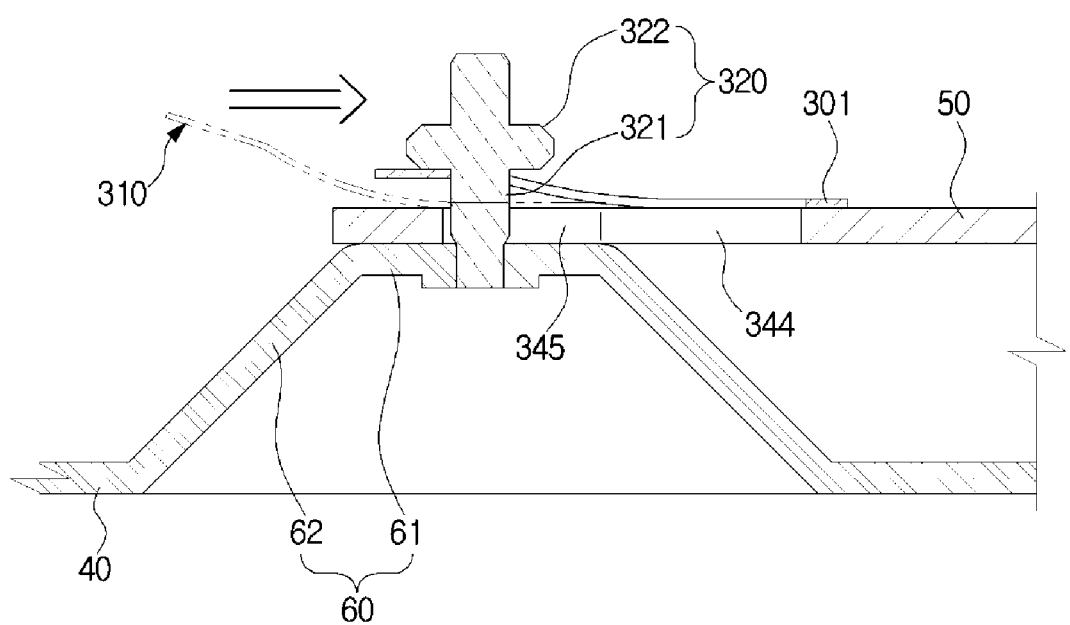
FIG. 21 is a cross-sectional view showing an assembled state of the mounting member and a mounting portion, in the PCB mounting structure shown in FIG. 17.

FIG. 17 shows a state in which a PCB is separated from a chassis, in a PCB mounting structure according to another embodiment of the present disclosure, FIG. 18 shows a state in which the PCB is rested on a board resting portion of the chassis, in the PCB coupling structure shown in FIG. 17, and FIG. 19 shows a state in which the PCB is mounted on the chassis, in the PCB mounting structure shown in FIG. 17. Also, FIG. 20 shows a state in which the PCB is separated from a mounting member, in the PCB mounting structure shown in FIG. 17, and FIG. 21 is a cross-sectional view showing an assembled state of the mounting member and a mounting portion, in the PCB mounting structure shown in FIG. 17.

Referring to FIGS. 17, 18, and 19, the chassis 40 may include the board resting portion 60 on which the PCB 50 is rested. The board resting portion 60 may have the same shape and function as those of the board resting portion 60 shown in FIGS. 3, 4, and 5.

Like the embodiment shown in FIGS. 3, 4, and 5, the PCB 50 may be rested on the board resting portion 60 and then slide to be mounted on the chassis 40, however, unlike the embodiment shown in FIGS. 3, 4, and 5, the board resting portion 60 shown in FIGS. 17, 18, and 19 may include no guide protrusion, and a mounting portion 320 protruding from the board resting portion 60 may function as a guide protrusion.

If the PCB 50 is rested on the board resting portion 60 and then slides, the PCB 50 may be mounted on the chassis 40 by a mounting member 300 provided on the PCB 50. The mounting member 300 may be fixed on the PCB 50, and removably coupled with the mounting portion 320 formed on at least one of the board resting portion 60.

More specifically, the mounting portion 320 formed on the board resting portion 60 may include a neck 321 (see FIG. 21) connected to the top surface 61 of the board resting portion 60, and a head 322 (see FIG. 21) connected to the neck 321 and having a cross-sectional area that is wider than the cross-sectional area of the neck 321. The neck 321 may be formed in the shape of a cylinder, and the head 322 may be formed in the shape of a disk. The mounting portion 320 may be bonded on the board resting portion 60 in such a way to be electrically connected to the board resting portion 60, or may be integrated into the board resting portion 60.

Referring to FIG. 20, the PCB 50 may include a mounting hole 343 in which the mounting member 300 can be installed. The mounting member 300 may include a support portion 301 rested and supported on the PCB 50, and a lead 302 which protrudes from the support portion 301 and can be inserted into the mounting hole 343 of the PCB 50.

The mounting member 300 may include a conductive material, and at least one of the support portion 301 and the lead 302 may be bonded on the PCB 50 by the conductive material so that the mounting member 300 can be electrically connected to the PCB 50.

The PCB 50 may include a first through hole 344 through which the head 322 of the mounting portion 320 can pass, and a first guide hole 345 which extends from the first through hole 344 and along which the neck 321 of the mounting portion 320 can slide.

The mounting member 300 may include a second through hole 304 corresponding to the first through hole 344 of the PCB 50, and a second guide hole 305 corresponding to the first guide hole 345 of the PCB 50. The second through hole 304 may be formed in the support portion 301 of the mounting member 300, and the second guide hole 305 may be formed in a pressing portion 310 of the mounting member 300.

Referring to FIG. 21, the pressing portion 310 may extend from the support portion 301, and may press the head 322 of the mounting portion 320 if the PCB 50 is mounted. That is, the pressing portion 310 may be inclined upward along a direction in which the second guide hole 305 extends from the second through hole 304. If the PCB 50 is rested on the board resting portion 60 and then slides, the pressing portion 310 of the mounting member 300 may be elastically deformed by the head 322 of the mounting portion 320, so that the end of the pressing portion 310 can press the lower surface of the head 322 of the mounting portion 320.

Hereinafter, a PCB mounting structure according to another embodiment of the present disclosure will be described with reference to FIGS. 22 and 25.

Figure 22:
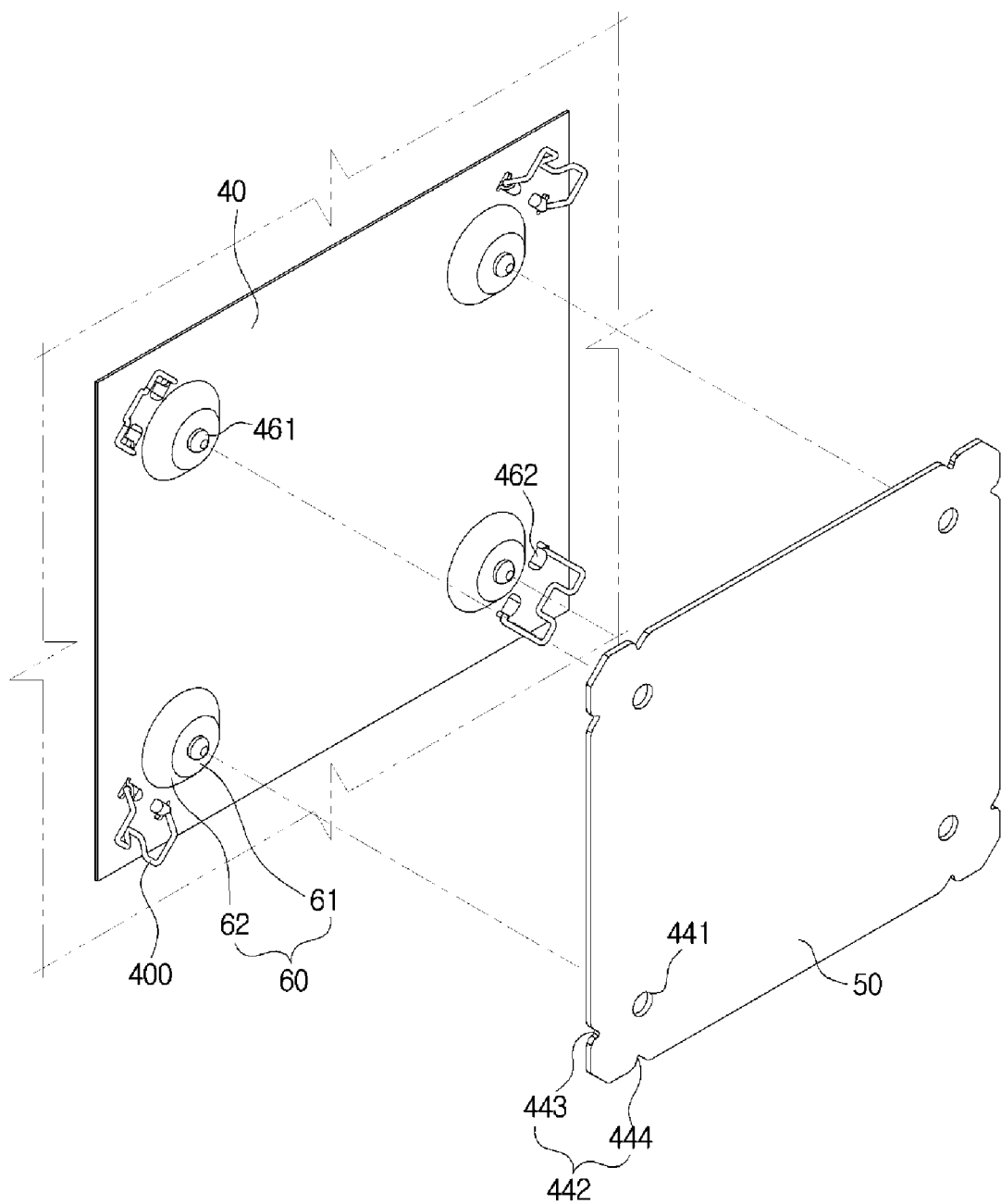
FIG. 22 shows a state in which a PCB is separated from a chassis, in a PCB mounting structure according to another embodiment of the present disclosure.
Figure 23:
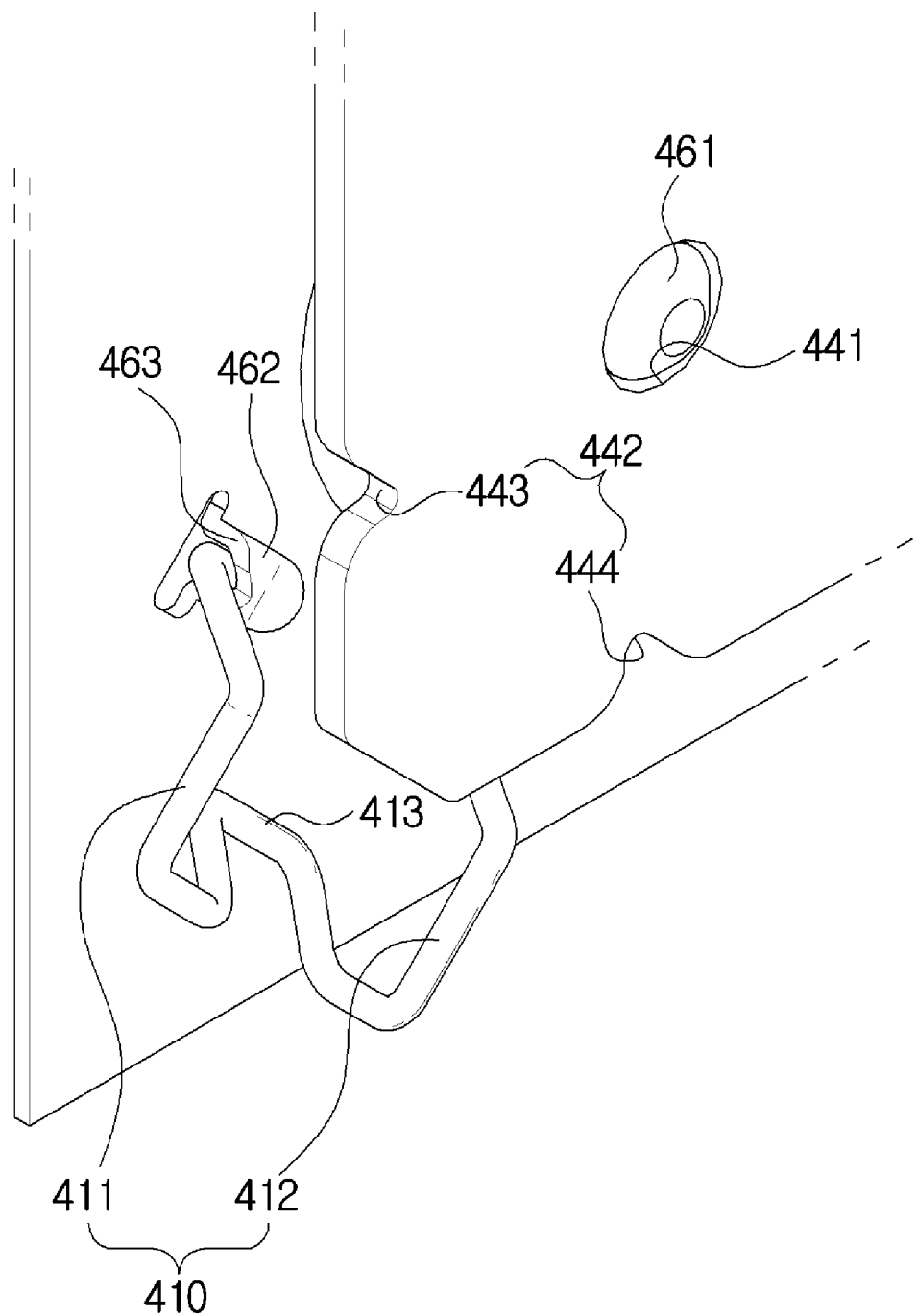
FIG. 23 shows a state in which the PCB is rested on a board resting portion of the chassis, in the PCB mounting structure shown in FIG. 22.
Figure 24:
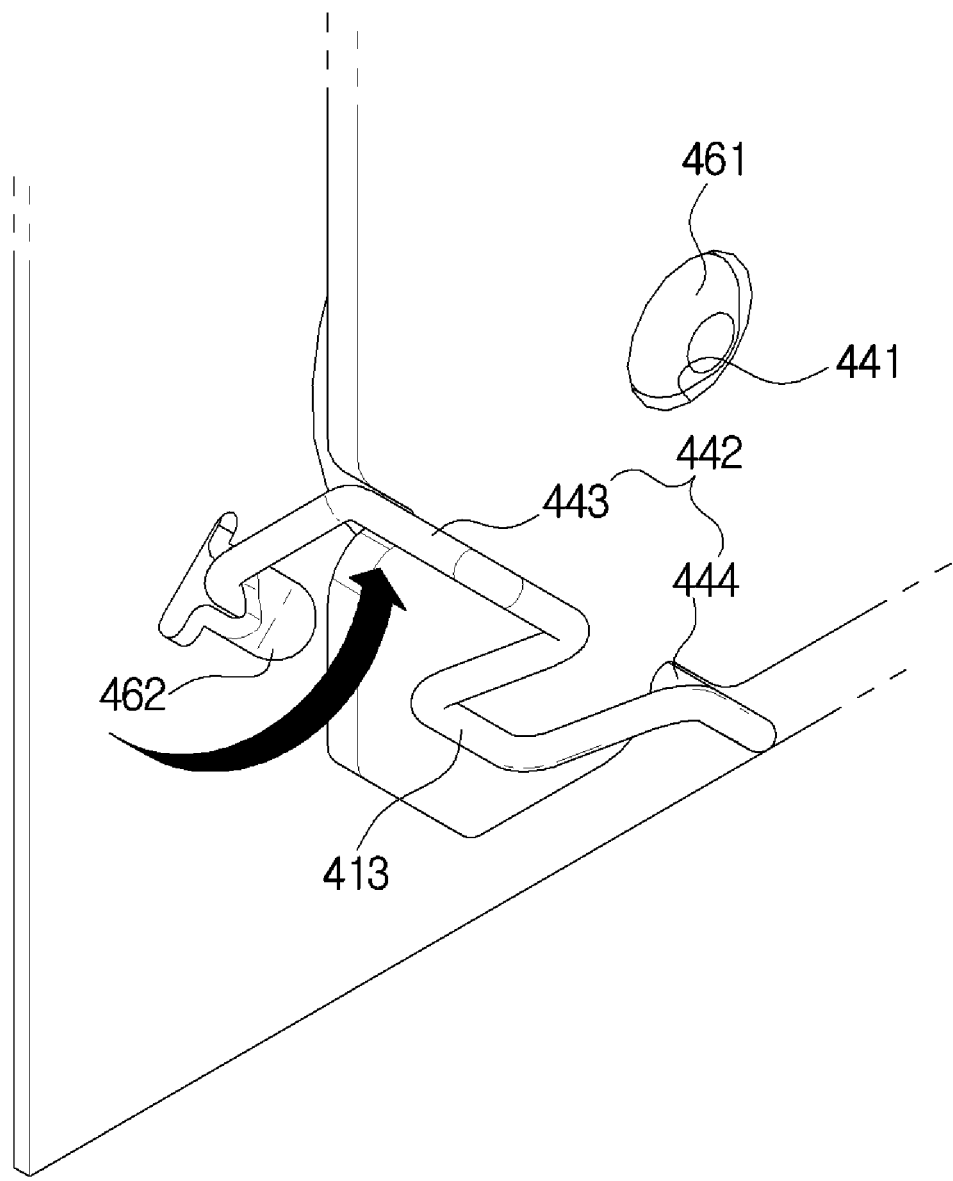
FIG. 24 shows a state in which the PCB is mounted on the chassis, in the PCB mounting structure shown in FIG. 22.
Figure 25:
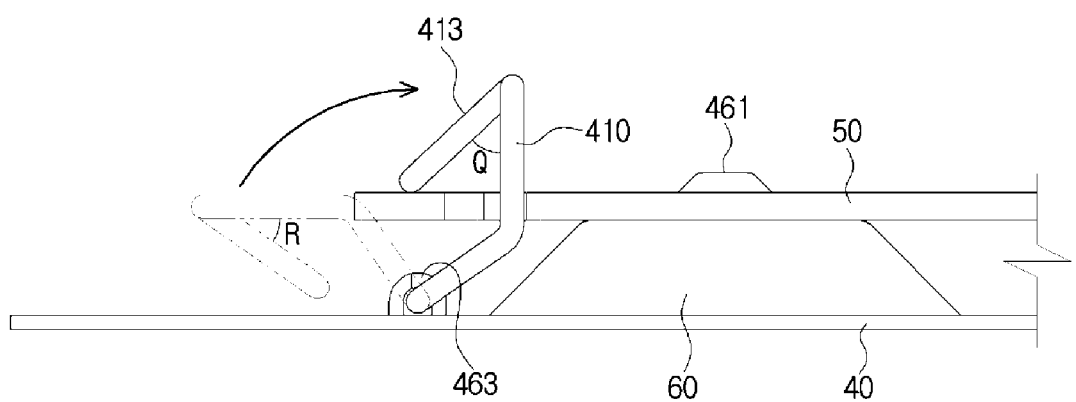
FIG. 25 is a side view showing an assembled state of the PCB and the chassis, in the PCB mounting structure of FIG. 22.

FIG. 22 shows a state in which a PCB is separated from a chassis, in a PCB mounting structure according to another embodiment of the present disclosure, FIG. 23 shows a state in which the PCB is rested on a board resting portion of the chassis, in the PCB mounting structure shown in FIG. 22, FIG. 24 shows a state in which the PCB is mounted on the chassis, in the PCB mounting structure shown in FIG. 22, and FIG. 25 is a side view showing an assembled state of the PCB and the chassis, in the PCB mounting structure of FIG. 22.

Referring to FIGS. 22 and 25, the chassis 40 may include the board resting portion 60 on which the PCB 50 is rested. The board resting portion 60 may have the same shape and function as those of the board resting portion 60 shown in FIGS. 3, 4, and 5.

The PCB 50 may be rested on the board resting portion 60, and then mounted on the chassis 40 by rotation of a mounting member 400. In order for the PCB 50 to be easily mounted on the board resting portion 60, a guide protrusion 461 for guiding a resting position of the PCB 50 may be formed on the top surface 61 of the board resting portion 60.

The PCB 50 may include a guide groove 441 to accommodate the guide protrusion 461, and a coupling groove 442 that can be coupled with the mounting member 400. If the PCB 50 is a rectangular flat plate, the guide groove 441 may be formed in each of the corners of the PCB 50, and a first coupling groove 443 and a second coupling groove 444 may be respectively formed at two edges forming each corner.

The chassis 40 may include an installation portion 462 which is disposed adjacent to each corner of the PCB 50 and with which the mounting member 400 can be rotatably coupled. The installation portion 462 may include a stopper 463 configured to prevent the mounting member 400 from rotating from a released position to a mounting position when no external force is applied.

The mounting member 400 may include a coupling portion 410 removably coupled with the coupling groove 442 of the PCB 50, and a pressing portion 413 to press the PCB 50 toward the chassis 40. The mounting member 400 may be formed of a linear material having elasticity, and the coupling portion 410 may include a first coupling section 411 and a second coupling section 412 that can be respectively coupled with the first coupling groove 443 and the second coupling groove 444. The pressing portion 413 may be formed between the first coupling section 411 and the second coupling section 412 to press the corner of the PCB 50.

The distance between the first coupling section 411 and the second coupling section 412 may be shorter than the shortest distance between the first coupling groove 443 and the second coupling groove 444 of the PCB 50 so that the coupling portion 410 can elastically support the coupling groove 442 when the mounting member 400 is at the mounting position. The pressing portion 413 may contact the PCB 50 before the coupling portion 410 is coupled with the coupling groove 442, and when the coupling portion 410 is fixed at the coupling groove 442, the pressing portion 413 may press the PCB 50.

Referring to FIG. 25, since an angle Q between the pressing portion 413 and the coupling portion 410 when the mounting member 400 is at the mounting position is greater than an angle R between the pressing portion 413 and the coupling portion 410 when the mounting member 400 is at the released position, due to elastic deformation, the pressing portion 413 can elastically support the PCB 50.

Hereinafter, a PCB mounting structure according to another embodiment of the present disclosure will be described with reference to FIGS. 26 to 32.

Figure 26:
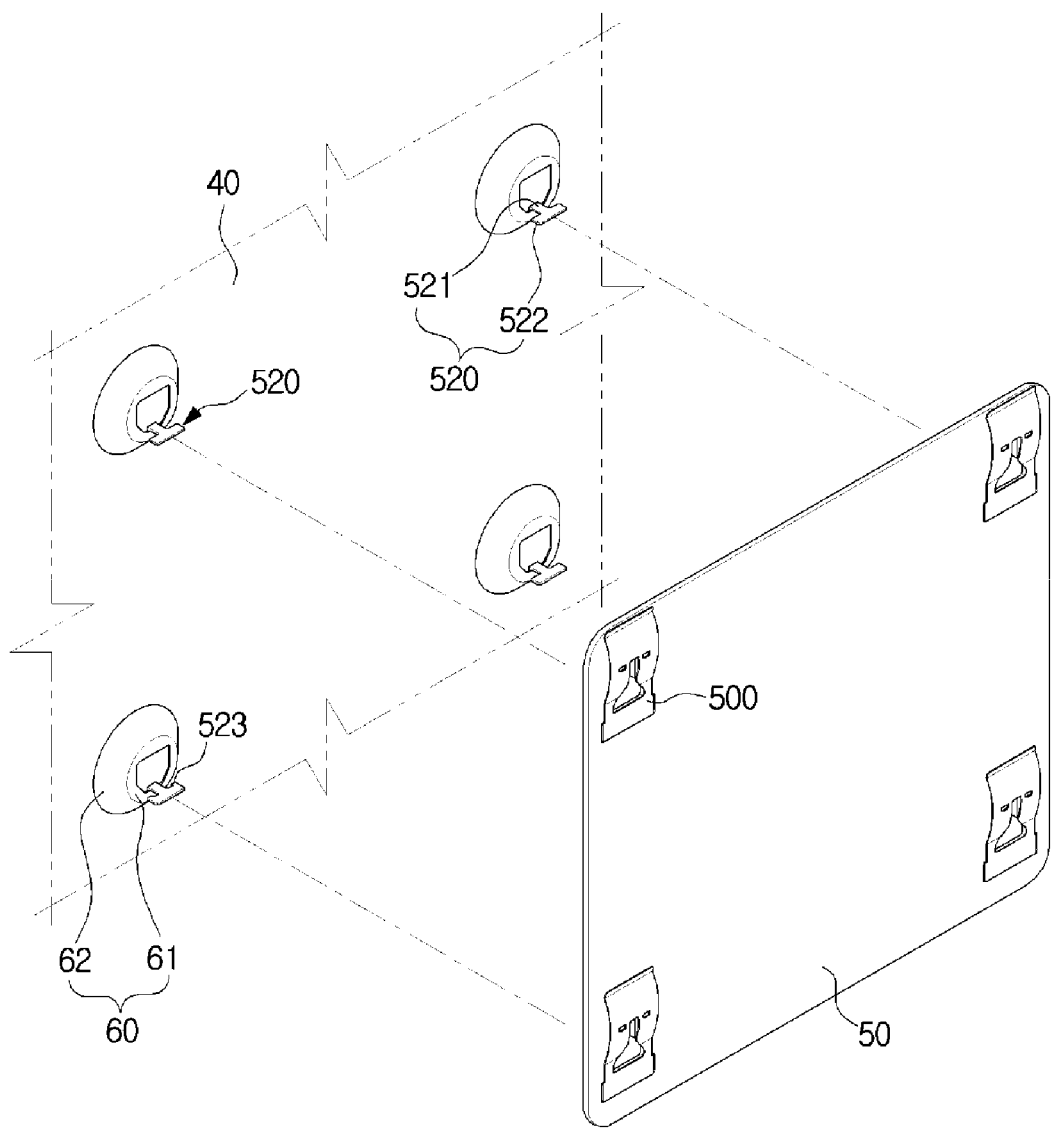
FIG. 26 shows a state in which a PCB is separated from a chassis, in a PCB mounting structure according to another embodiment of the present disclosure.
Figure 27:
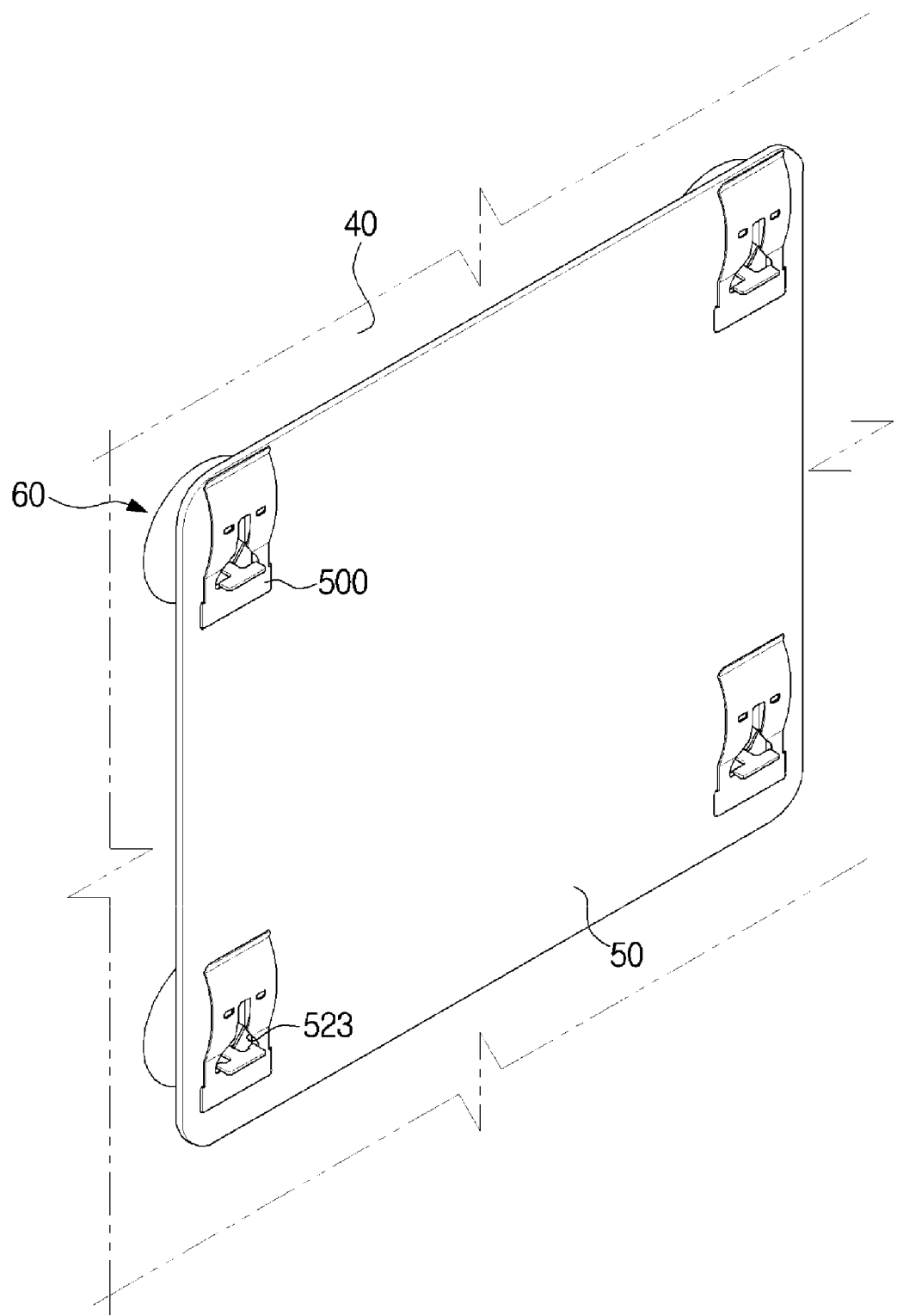
FIG. 27 shows a state in which the PCB is rested on a board resting portion of the chassis, in the PCB mounting structure shown in FIG. 26.
Figure 28:
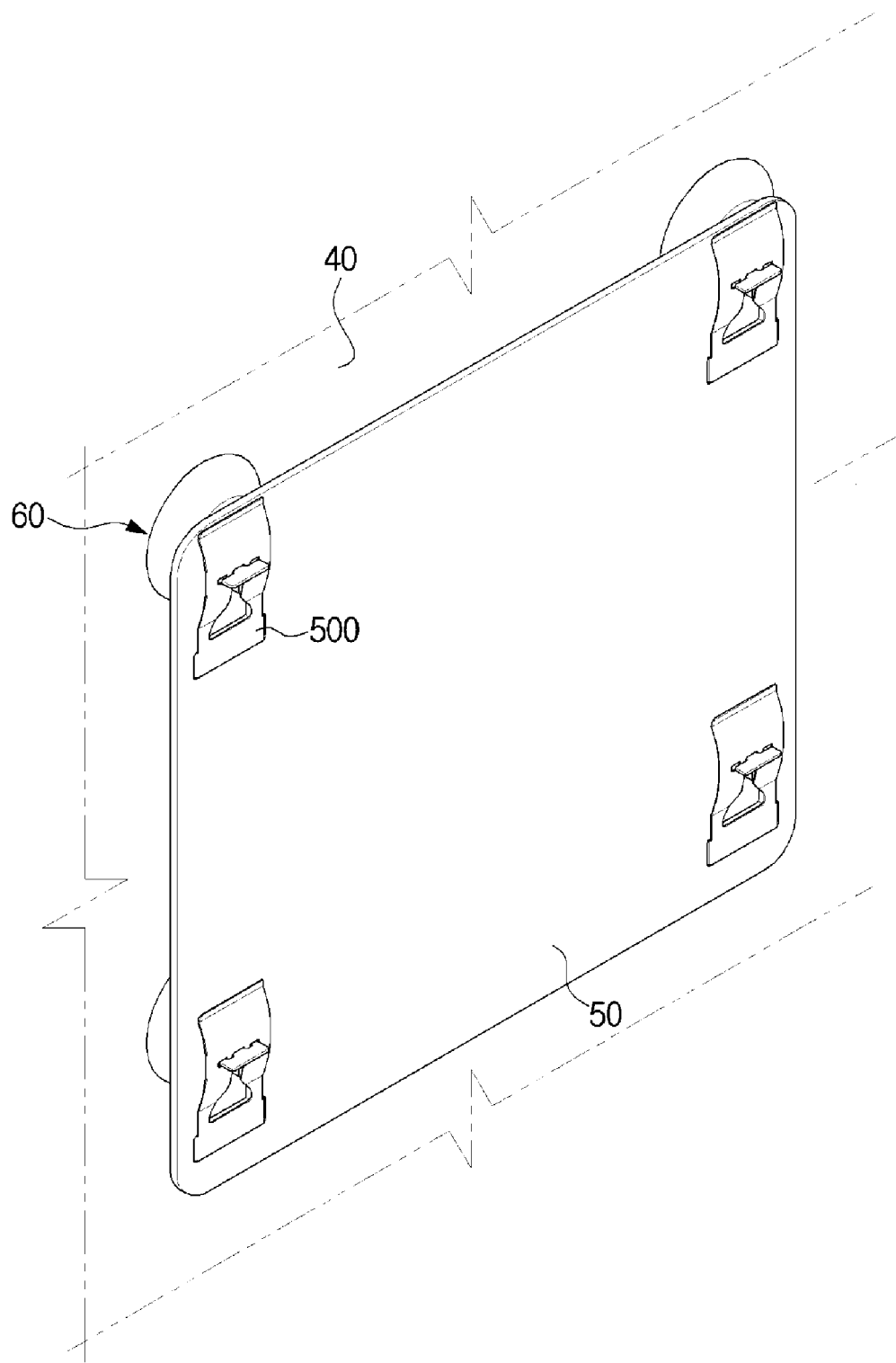
FIG. 28 shows a state in which the PCB is mounted on the chassis, in the PCB mounting structure shown in FIG. 26.
Figure 29:
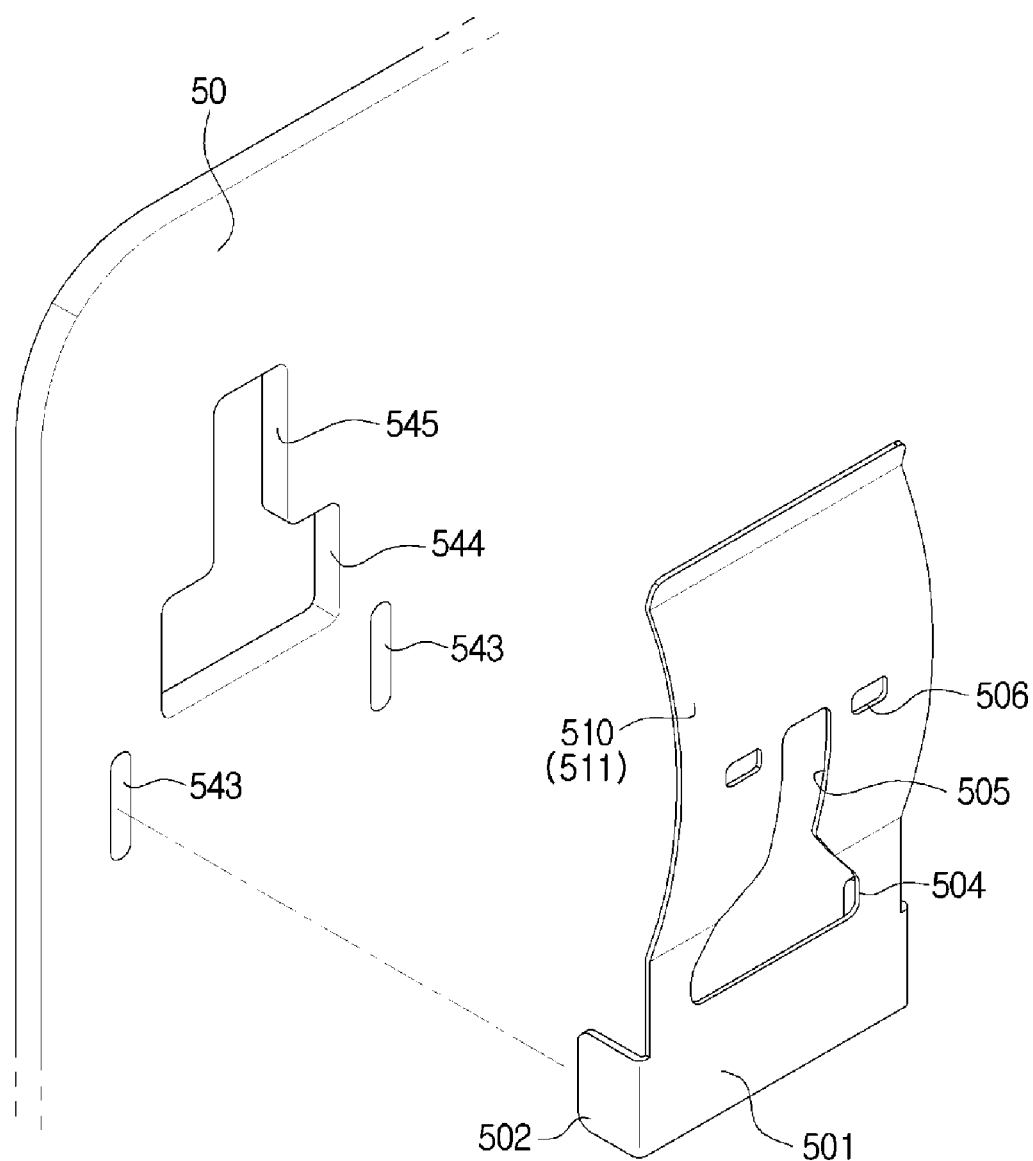
FIG. 29 shows a state in which the PCB is separated from a mounting member, in the PCB mounting structure shown in FIG. 26.

FIG. 26 shows a state in which a PCB is separated from a chassis, in a PCB mounting structure according to another embodiment of the present disclosure, FIG. 27 shows a state in which the PCB is rested on a board resting portion of the chassis, in the PCB mounting structure shown in FIG. 26, FIG. 28 shows a state in which the PCB is mounted on the chassis, in the PCB mounting structure shown in FIG. 26, and FIG. 29 shows a state in which the PCB is separated from a mounting member, in the PCB mounting structure shown in FIG. 26.

Referring to FIGS. 26 to 29, the chassis 40 may include the board resting portion 60 on which the PCB 50 is rested or rests. The board resting portion 60 may have the same shape and function as those of the board resting portion 60 shown in FIGS. 3, 4, and 5.

Like the embodiment shown in FIGS. 3, 4, and 5, the PCB 50 may be rested on the board resting portion 60 and then slide to be mounted on the chassis 40, and unlike the embodiment shown in FIGS. 3, 4, and 5, the board resting portion 60 shown in FIGS. 26 to 32 may include no guide protrusion, and a mounting portion 520 protruding from the board resting portion 60 may function as a guide protrusion.

If the PCB 50 is rested on the board resting portion 60 and then slides, the PCB 50 may be mounted on the chassis 40 by a mounting member 500 provided on the PCB 50. The mounting member 500 may be fixed on the PCB 50, and removably coupled with a mounting portion 520 formed in at least one of the board resting portion 60.

More specifically, the mounting portion 520 formed in the board resting portion 60 may include a neck 521 connected to the top surface 61 of the board resting portion 60, and a head 522 connected to the neck 521 and having a cross-sectional area that is wider than a cross-sectional area of the neck 521. The neck 521 may be in the shape of a plate member having a narrow width, and the head 522 may be in the shape of a plate member having a wider width than the neck 521. The mounting portion 520 may be bonded on the board resting portion 60 in such a way to be electrically connected to the board resting portion 60, or may be integrated into the board resting portion 60.

Referring to FIG. 29, the PCB 50 may include an installation hole 543 in which the mounting member 500 can be installed. The mounting member 500 may include a support portion 501 rested and supported on the PCB 50, and a lead 502 protruding from the support portion 501 and inserted into the installation hole 543 of the PCB 50.

The mounting member 500 may include a conductive material, and at least one of the support portion 501 and the lead 502 may be bonded on the PCB 50 by the conductive material in such a way to be electrically connected to the PCB 50.

The PCB 50 may include a first through hole 544 through which the head 522 of the mounting portion 520 can pass, and a first guide hole 545 which extends from the first through hole 544 and along which the neck 521 of the mounting portion 520 can slide.

The mounting member 500 may include a second through hole 504 corresponding to the first through hole 544 of the PCB 50, and a second guide hole 505 corresponding to the first guide hole 545 of the PCB 50. The second through hole 504 may be formed in the support portion 501 of the mounting member 500, and the second guide hole 505 may be formed in the pressing portion 510 of the mounting member 500.

Figure 30:
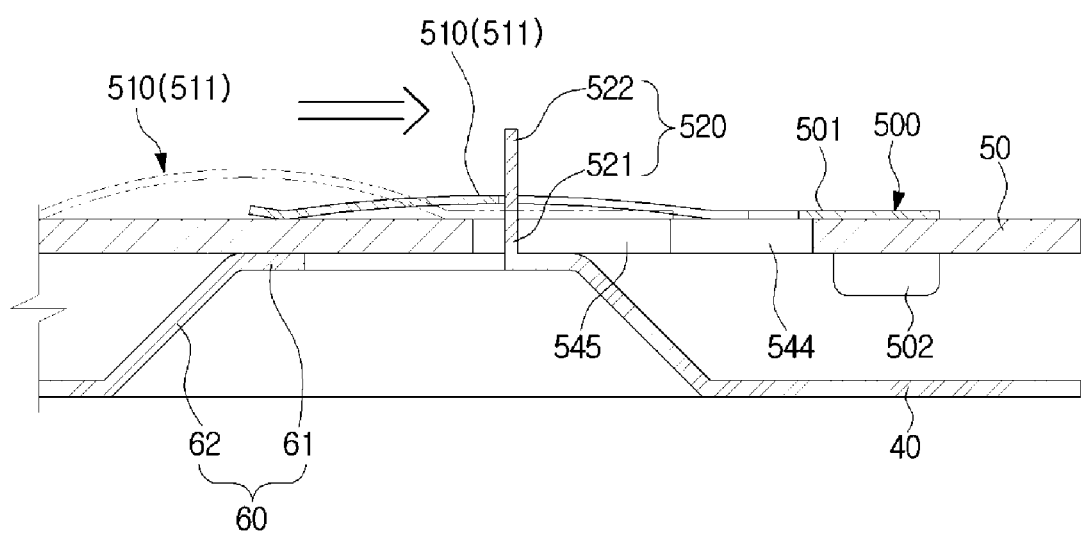
FIG. 30 is a cross-sectional view showing an assembled state of the mounting member and the mounting portion, in the PCB mounting structure shown in FIG. 26.
Figure 31:
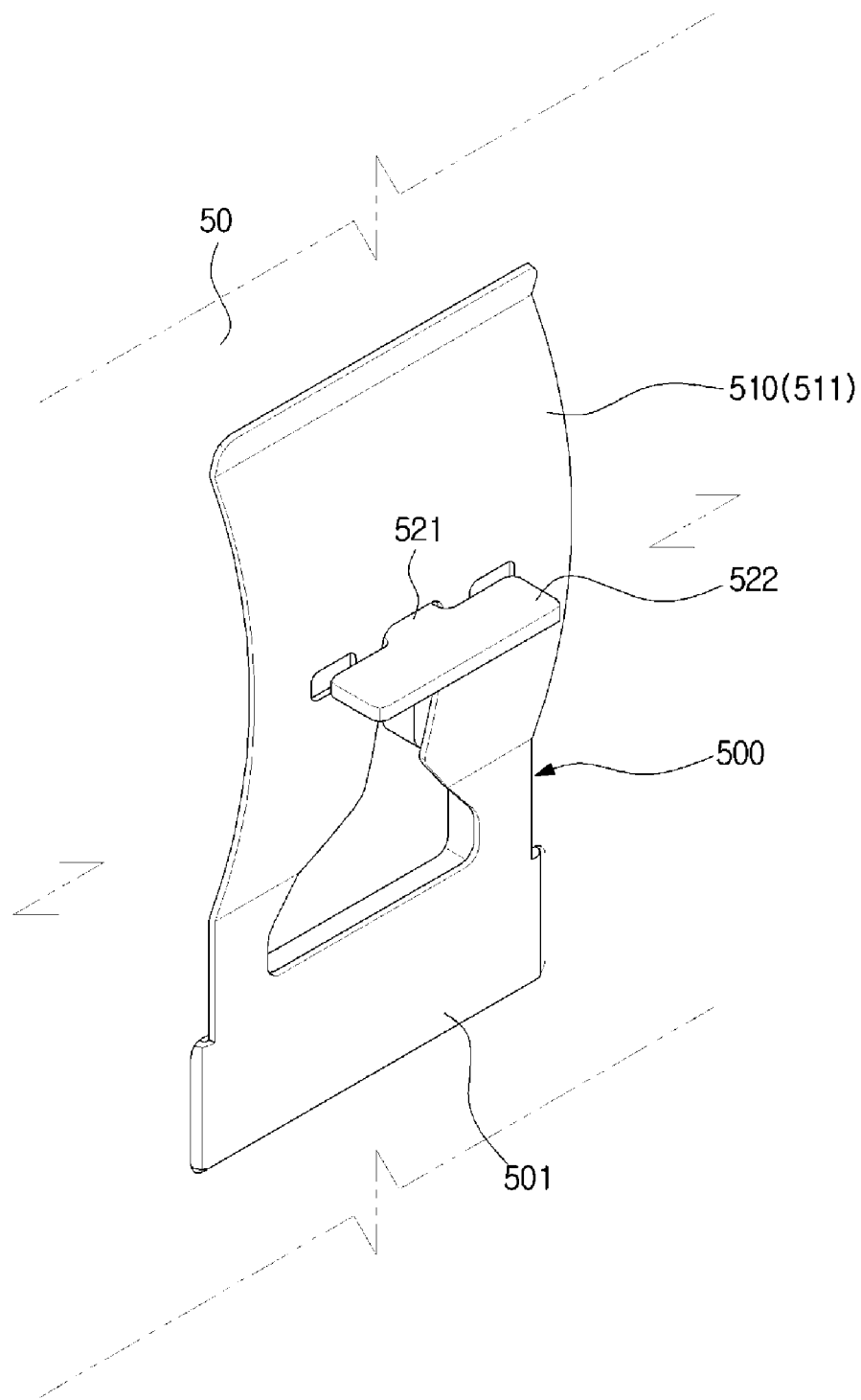
FIG. 31 is an enlarged view of two types of mounting portions of the chassis, in the PCB mounting structure shown in FIG. 26.
Figure 32:
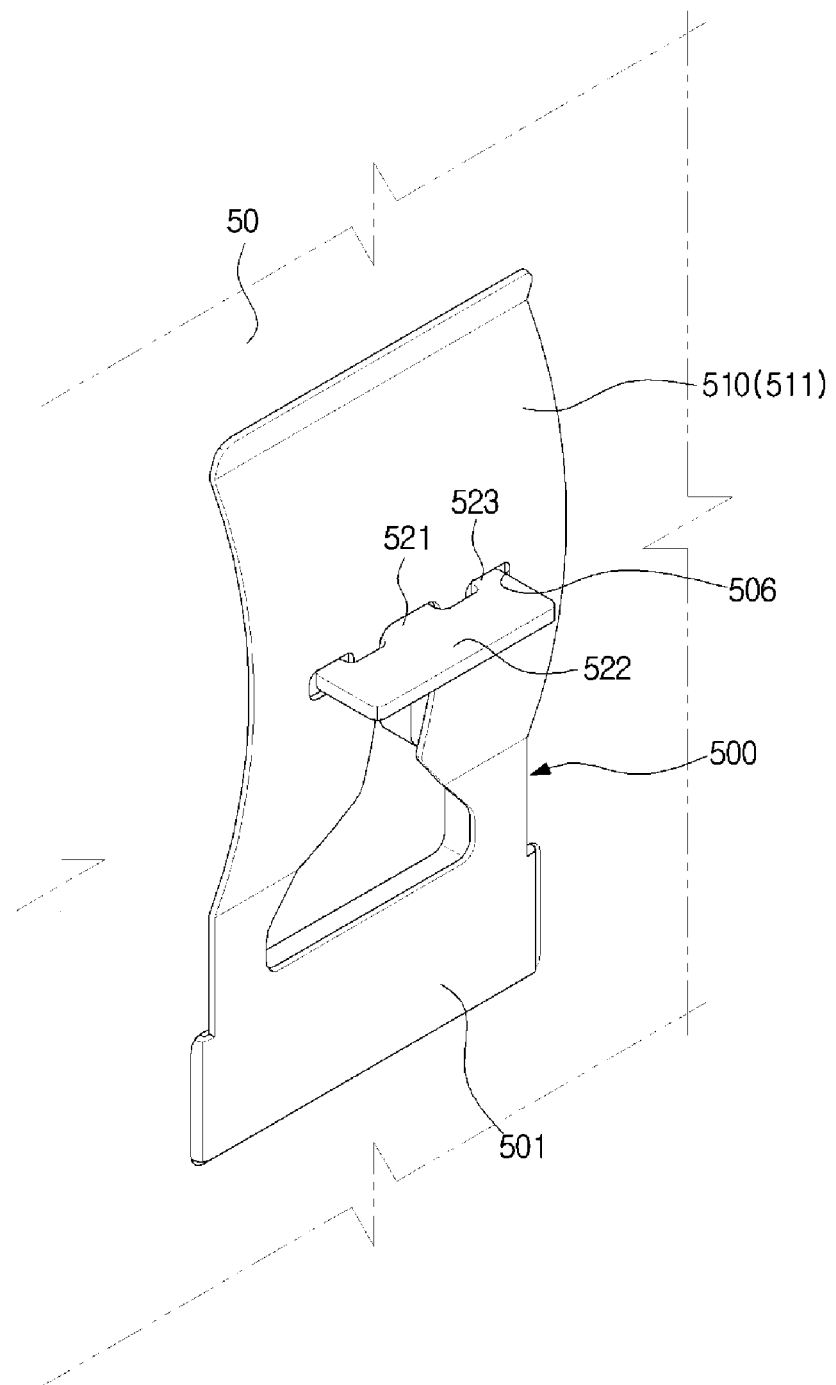
FIG. 32 is an enlarged view of two types of mounting portions of the chassis, in the PCB mounting structure shown in FIG. 26.

FIG. 30 is a cross-sectional view showing an assembled state of the mounting member and the mounting portion, in the PCB mounting structure shown in FIG. 26, and FIGS. 31 and 32 are enlarged views of two types of mounting portions of the chassis, in the PCB mounting structure shown in FIG. 26.

Referring to FIG. 30, the pressing portion 510 may extend from the support portion 501, and press the head 522 of the mounting portion 520 if the PCB 50 is mounted. That is, the pressing portion 510 may include an arc structure 511 protruding from the PCB 50, and the second guide hole 505 may extend from the second through hole 504 to the top of the arc structure 511.

If the PCB 50 is rested on the board resting portion 60 and then slides, the head 522 of the mounting portion 520 may press the arc structure 511 of the pressing portion 510 to elastically deform the pressing portion 510, so that the end of the pressing portion 510 can press the PCB 50.

Referring to FIGS. 26 to 28 and FIGS. 31 and 32, the mounting portion 520 may include a stopper 523, in order to prevent the PCB 50 sliding and rested at a predetermined position on the chassis 40 from escaping from the chassis 40.

The stopper 523 may protrude from the head 522 toward the PCB 50, and the mounting member 500 may include a stopper accommodating groove 506. The stopper accommodating groove 506 may be formed in the top portion of the arc structure 511 of the pressing portion 510, at which the second guide hole 505 of the mounting member 100 ends.

If or when a plurality of mounting portions 520 are formed, the stopper 523 may be formed in at least one of the mounting portions 520. As shown in FIGS. 26, 27, and 28, if the stopper 523 is formed in one of the mounting portions 520, the PCB 40 can be easily separated from the chassis 40 by pressing the pressing portion 510 of the mounting portion 520 to separate the stopper 523 from the stopper accommodating groove 506.

The PCB mounting structures as described above can be used in the display apparatus 1. Also, the PCB mounting structures can be applied to all kinds of electronic products in which a PCB is used. Further, the PCB mounting structures can be modified that a plurality of resting portions are disposed on a PCB and a mounting member is fixed on a chassis.

Since the PCB slides to be assembled with the chassis using the mounting member provided on the PCB, screws used in typical PCB assembling processes are not needed, resulting in reduction of manufacturing costs and manufacturing time.

Particularly, since the mounting member capable of being slidingly coupled, instead of screws, is used in a process of assembling the display apparatus, the thickness of the display apparatus can be designed without considering the lengths of screw threads, which may contribute to a slim design of the display apparatus.

Also, since no separate tool for mounting the PCB is needed, the PCB can be easily mounted, and also can be easily removed or replaced for maintenance.

The present disclosure also to provides a system including a chassis having a rest protruding therefrom, the rest including a slide hole in a side of the rest; and a mount attached to a printed circuit board and having a spring slidable into the slide hole with the spring engaging the hole and pulling the board against the rest locking the board against the rest of the chassis.

The present disclosure also provides a system including a chassis having a rest protruding therefrom, the rest including a slide hole in a side of the rest; a mount attached to a printed circuit board and having a spring slidable into the slide hole with the spring engaging the hole and pulling the board against the rest locking the board against the rest of the chassis; and a stop on the rest engaging a lock hole in the board preventing the spring from sliding out of the slide hole.

The present disclosure also provides a system including a chassis having a rest protruding therefrom, the rest including a slide hole in a side of the rest; a mount attached to a printed circuit board and having a spring slidable into the slide hole with the spring engaging the hole and pulling the board against the rest locking the board against the rest of the chassis; and a chamfer on the spring engaging an edge of the hole resisting the spring to enter the slide hole.

The present disclosure also provides a system including a chassis having a rest protruding therefrom, the rest including a slide hole in a side of the rest; a mount attached to a printed circuit board and having a spring slidable into the slide hole with the spring engaging the hole and pulling the board against the rest locking the board against the rest of the chassis and having a lead; and an installation hole into which the lead extends preventing the spring from sliding out of the slide hole.

The present disclosure also provide a system including a chassis having a rest protruding therefrom, the rest including a pair of opposing springs extending from the rest; and a printed circuit board having a through hole into which the pair of opposing springs are inserted and which engages the pair of opposing springs pulling the board against the rest locking the board against the rest of the chassis.

The present disclosure also provides a system including a chassis having a rest protruding therefrom, the rest including a neck and a head; and a printed circuit board and having hole through which the head extends and a guide in which the neck slides locking the board against the rest of the chassis.

The present disclosure also provides a system including a chassis having a rest protruding therefrom, the rest including a guide protrusion and a rotatable latch; and a printed circuit board having hole through which guide protrusion extends the latch rotatable around a corner of the board and engaging the protrusion locking the board against the rest of the chassis.

The present disclosure also provides a mounting structure, including a chassis on which a Printed Circuit Board (PCB) mountable; and a mounting member fixed on the on the PCB, and configured to slide to fix the PCB on the chassis.

The present disclosure also provides a mounting method, including pressing a mount of a printed circuit board against a rest protruding from a chassis; and sliding the mount against the rest to engage a spring of the mount with a slide hole of the rest locking the board against the rest of the chassis.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A Printed Circuit Board (PCB) mounting structure, comprising:
   a chassis on which a plurality of board resting portions are disposed;
   a PCB resting on the plurality of board resting portions and including an installation hole;
   a mounting portion disposed on a respective board resting portion of the plurality of board resting portions; and
   a mounting member including a support portion supported on the PCB, and a lead protruding from the support portion and inserted in the installation hole so that the mounting member is thereby fixed on the PCB,
   wherein the mounting member is removably coupleable with the mounting portion by a sliding movement of the PCB,
   wherein the mounting portion is bonded on the respective board resting portion and electrically connected to the respective board resting portion,
   wherein the mounting portion comprises a neck connected to the respective board resting portion, and a head connected to the neck and having a cross-sectional area wider than a cross-sectional area of the neck,
   wherein the mounting member and the mounting portion are configured so that, when the mounting member is coupled with the mounting portion, the mounting member is around the neck and below the head, and
   wherein the chassis, the respective board resting portion, the mounting portion and the mounting member are each made of a conductive material, and at least one of the support portion and the lead is bonded to the PCB and electrically connected to the PCB, so that, when the mounting member is coupled with the mounting portion, Electro Magnetic Interference (EMI) grounding occurs between the PCB and the chassis through the respective board resting portion, the mounting portion and the mounting member.

2. The PCB mounting structure according to claim 1, wherein the PCB comprises a first through hole through which the head of the mounting portion passes, and a first guide hole which extends from the first through hole and along which the neck of the mounting portion slides.

3. The PCB mounting structure according to claim 2, wherein the mounting member comprises a second through hole corresponding to the first through hole, and a second guide hole corresponding to the first guide hole.

4. The PCB mounting structure according to claim 3, wherein the mounting member comprises a pressing portion extending from the support portion and configured to press at least one of the head and the PCB.

5. The PCB mounting structure according to claim 4, wherein the second through hole is formed in the support portion of the mounting member, and the second guide hole is formed in the pressing portion.

6. The PCB mounting structure according to claim 5, wherein the pressing portion comprises an arc structure protruding from the PCB.

7. The PCB mounting structure according to claim 6,
   wherein the mounting portion comprises a stopper protruding from the head toward the PCB, and
   wherein the mounting member comprises a stopper accommodating groove formed in a top portion of the arc structure.

8. The PCB mounting structure according to claim 5,
   wherein the second guide hole extends from the second through hole to a top portion of the mounting member, and
   wherein when the PCB is mounted, the head presses the arc structure with the pressing portion of the mounting member pressing the PCB.

9. The PCB mounting structure according to claim 6, wherein the second guide hole extends from the second through hole to a top portion of the arc structure.

10. A Printed Circuit Board (PCB) mounting structure, comprising:
    a chassis on which a plurality of board resting portions are disposed;
    a PCB resting on the plurality of board resting portions and including an installation hole;
    a mounting portion integrated into a respective board resting portion of the plurality of board resting portions; and a mounting member including a support portion supported on the PCB, and a lead protruding from the support portion and inserted in the installation hole so that the mounting member is thereby fixed on the PCB, wherein the mounting member is removably coupleable with the mounting portion by a sliding movement of the PCB, wherein the mounting portion is bonded on the respective board resting portion and electrically connected to the respective board resting portion, wherein the mounting portion comprises a neck connected to the respective board resting portion, and a head connected to the neck and having a cross-sectional area wider than a cross-sectional area of the neck, wherein the mounting member and the mounting portion are configured so that, when the mounting member is coupled with the mounting portion, the mounting member is around the neck and below the head, and wherein the chassis, the respective board resting portion, the mounting portion and the mounting member are each made of a conductive material, and at least one of the support portion and the lead is bonded to the PCB and electrically connected to the PCB, so that, when the mounting member is coupled with the mounting portion, Electro Magnetic Interference (EMI) grounding occurs between the PCB and the chassis through the respective board resting portion, the mounting portion and the mounting member.

11. A Printed Circuit Board (PCB) mounting structure, comprising:

a chassis on which a plurality of board resting portions are disposed;

a PCB resting on the plurality of board resting portions;

a mounting portion disposed on a respective board resting portion of the plurality of board resting portions; and a mounting member fixed on the PCB, and removably coupleable with the mounting portion by a sliding movement of the PCB, wherein the mounting portion is bonded on the respective board resting portion and electrically connected to the respective board resting portion, wherein the mounting portion comprises a neck connected to the respective board resting portion, and a head connected to the neck and having a cross-sectional area wider than a cross-sectional area of the neck, wherein the mounting portion comprises a stopper protruding from the head toward the PCB, and wherein the mounting member comprises a stopper accommodating groove formed in a top portion of the arc structure.

12. A Printed Circuit Board (PCB) mounting structure, comprising:

a chassis on which a plurality of board resting portions are disposed;

a PCB resting on the plurality of board resting portions and including an installation hole;

a mounting portion disposed on a respective board resting portion of the plurality of board resting portions; and a mounting member including a support portion supported on the PCB, and a lead protruding from the support portion and inserted in the installation hole so that the mounting member is thereby fixed on the PCB, wherein the mounting member is removably coupleable with the mounting portion by a sliding movement of the PCB, wherein the mounting portion is bonded on the respective board resting portion and electrically connected to the respective board resting portion, wherein the mounting portion comprises a neck connected to the respective board resting portion, and a head connected to the neck and having a cross-sectional area wider than a cross-sectional area of the neck, wherein the chassis, the respective board resting portion, the mounting portion and the mounting member are each made of a conductive material, and at least one of the support portion and the lead is bonded to the PCB and electrically connected to the PCB, so that, when the mounting member is coupled with the mounting portion, Electro Magnetic Interference (EMI) grounding occurs between the PCB and the chassis through the respective board resting portion, the mounting portion and the mounting member, wherein the PCB comprises a first through hole through which the head of the mounting portion passes, and a first guide hole which extends from the first through hole and along which the neck of the mounting portion slides, wherein the mounting member comprises a second through hole corresponding to the first through hole, and a second guide hole corresponding to the first guide hole, and wherein the mounting member comprises a pressing portion extending from the support portion and configured to press at least one of the head and the PCB.

13. The PCB mounting structure according to claim 12, wherein the second through hole is formed in the support portion of the mounting member, and the second guide hole is formed in the pressing portion.

14. The PCB mounting structure according to claim 13, wherein the pressing portion comprises an arc structure protruding from the PCB.

15. The PCB mounting structure according to claim 14, wherein the mounting portion comprises a stopper protruding from the head toward the PCB, and wherein the mounting member comprises a stopper accommodating groove formed in a top portion of the arc structure.

16. The PCB mounting structure according to claim 13, wherein the second guide hole extends from the second through hole to a top portion of the mounting member, and wherein when the mounting member is coupled with the mounting portion, the head presses the arc structure with the pressing portion of the mounting member pressing the PCB.

17. The PCB mounting structure according to claim 14, wherein the second guide hole extends from the second through hole to a top portion of the arc structure.

* * * * *